(12) United States Patent
Campbell et al.

(10) Patent No.: US 9,865,522 B2
(45) Date of Patent: Jan. 9, 2018

(54) COMPOSITE HEAT SINK STRUCTURES

(71) Applicant: INTERNATIONAL BUSINESS MACHINES CORPORATION, Armonk, NY (US)

(72) Inventors: Levi A. Campbell, Poughkeepsie, NY (US); Milnes P. David, Fishkill, NY (US); Dustin W. Demetriou, Poughkeepsie, NY (US); Michael J. Ellsworth, Jr., Poughkeepsie, NY (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 488 days.

(21) Appl. No.: 14/546,136

(22) Filed: Nov. 18, 2014

(65) Prior Publication Data

US 2016/0143189 A1 May 19, 2016

(51) Int. Cl.
*H01L 23/473* (2006.01)
*B29C 43/18* (2006.01)
(Continued)

(52) U.S. Cl.
CPC ............ *H01L 23/473* (2013.01); *B29C 43/18* (2013.01); *B29C 43/203* (2013.01); *B29C 70/84* (2013.01);
(Continued)

(58) Field of Classification Search
CPC ............ H01L 23/427; H01L 2/204363; H01L 23/4336; H01L 23/46; H05K 7/3672
See application file for complete search history.

(56) References Cited

U.S. PATENT DOCUMENTS 4,381,032 A 4/1983 Cutchaw
4,538,171 A 8/1985 Stevens et al.
(Continued)

FOREIGN PATENT DOCUMENTS

CN 2013-83909 Y 1/2010
JP 2006-339403 A 12/2006
(Continued)

OTHER PUBLICATIONS

Campbell et al., International Search Report & Written Opinion for PCT Application No. PCT/IB2015/058394, dated Jan. 26, 2016 (8 pages).
(Continued)

*Primary Examiner* — Zandra Smith
*Assistant Examiner* — Abbigale Boyle
(74) *Attorney, Agent, or Firm* — Steven Chiu, Esq.; Kevin P. Radian, Esq.; Heslin, Rothenberg, Farley & Mesiti P.C.

(57) ABSTRACT

Composite heat sink structures and methods of fabrication are provided, with the composite heat sink structures including: a thermally conductive base having a main heat transfer surface to couple to, for instance, at least one electronic component to be cooled; a compressible, continuous sealing member; and a sealing member retainer compressing the compressible, continuous sealing member against the thermally conductive base; and an in situ molded member. The in situ molded member is molded over and affixed to the thermally conductive base, and is molded over and secures in place the sealing member retainer. A coolant-carrying compartment resides between the thermally conductive base and the in situ molded member, and a coolant inlet and outlet are provided in fluid communication with the coolant-carrying compartment to facilitate liquid coolant flow through the compartment.

19 Claims, 19 Drawing Sheets

(51) Int. Cl.
    *B29C 43/20*         (2006.01)
    *H01L 23/427*      (2006.01)
    *H05K 7/20*         (2006.01)
    *B29C 70/84*         (2006.01)
    *B29C 70/88*         (2006.01)
    *B29L 9/00*          (2006.01)
    *B29K 101/12*      (2006.01)
    *B29K 705/00*      (2006.01)
    *B29L 31/34*        (2006.01)
    *H01L 23/367*      (2006.01)
    *H01L 23/40*        (2006.01)

(52) U.S. Cl.
    CPC ............ *B29C 70/88* (2013.01); *H01L 23/427* (2013.01); *H05K 7/20254* (2013.01); *H05K 7/20436* (2013.01); *H05K 7/20509* (2013.01); *H05K 7/20772* (2013.01); *B29K 2101/12* (2013.01); *B29K 2705/00* (2013.01); *B29L 2009/00* (2013.01); *B29L 2031/3406* (2013.01); *H01L 23/3672* (2013.01); *H01L 23/4006* (2013.01); *H01L 2924/0002* (2013.01)

(56) References Cited

U.S. PATENT DOCUMENTS

| | | | |
|---|---|---|---|
| 4,750,031 A | | 6/1988 | Miller et al. |
| 4,879,629 A | * | 11/1989 | Tustaniwskyj ...... H01L 23/4006 257/E23.084 |
| 5,070,936 A | | 12/1991 | Carroll et al. |
| 5,132,873 A | | 7/1992 | Nelson et al. |
| 5,168,348 A | * | 12/1992 | Chu ...................... H01L 23/367 257/713 |
| 5,660,758 A | | 8/1997 | McCullough |
| 5,660,759 A | | 8/1997 | McCullough |
| 6,085,785 A | | 7/2000 | Smitth, III |
| 6,141,219 A | | 10/2000 | Downing et al. |
| 6,351,384 B1 | * | 2/2002 | Daikoku ................... F28F 3/02 165/80.3 |
| 6,547,210 B1 | | 4/2003 | Marx et al. |
| 6,778,393 B2 | | 8/2004 | Messina et al. |
| 6,826,054 B2 | | 11/2004 | Liu |
| 6,892,801 B1 | | 5/2005 | Kim |
| 7,092,255 B2 | | 8/2006 | Barson et al. |
| 7,450,378 B2 | | 11/2008 | Nelson et al. |
| 7,486,514 B2 | | 2/2009 | Campbell et al. |
| 7,518,233 B1 | | 4/2009 | Takahashi et al. |
| 7,751,918 B2 | | 7/2010 | Campbell et al. |
| 2003/0042004 A1 | | 3/2003 | Novotny et al. |
| 2004/0212965 A1 | | 10/2004 | Ishii et al. |
| 2007/0069420 A1 | | 3/2007 | Kozyra et al. |
| 2008/0053640 A1 | | 3/2008 | Mok |
| 2008/0210405 A1 | | 9/2008 | Datta et al. |
| 2008/0296256 A1 | | 12/2008 | Panek |
| 2009/0316360 A1 | | 12/2009 | Campbell et al. |
| 2010/0328882 A1 | | 12/2010 | Campbell et al. |
| 2011/0299244 A1 | | 12/2011 | Dede et al. |
| 2012/0327603 A1 | | 12/2012 | Beaupre et al. |

FOREIGN PATENT DOCUMENTS

| | | |
|---|---|---|
| JP | 2009-206271 A | 9/2009 |
| JP | 2011-108141 A | 6/2011 |

OTHER PUBLICATIONS

Anonymous, "Method for an LGA Package Socket Assembly with a Threaded Socket Cap and Integrated Load Ring", IP.com, IPCOM000019059D, published Aug. 27, 2003 (5 pages).

Campbell et al., "Liquid-Cooled Heat Sink Assemblies", U.S. Appl. No. 14/546,159, filed Nov. 18, 2014 (52 pages).

Campbell et al., "List of IBM Patents or Patent Applications Treated As Related" for U.S. Appl. No. 14/546,136, filed Nov. 18, 2014, dated Nov. 18, 2014 (2 pages).

Campbell et al., Notice of Allowance for U.S. Appl. No. 14/546,159, filed Nov. 18, 2014, dated Feb. 22, 2016 (13 pages).

Campbell et al., Notice of Allowance for U.S. Appl. No. 14/828,767, filed Aug. 18, 2015, dated May 4, 2017 (10 pages).

\* cited by examiner

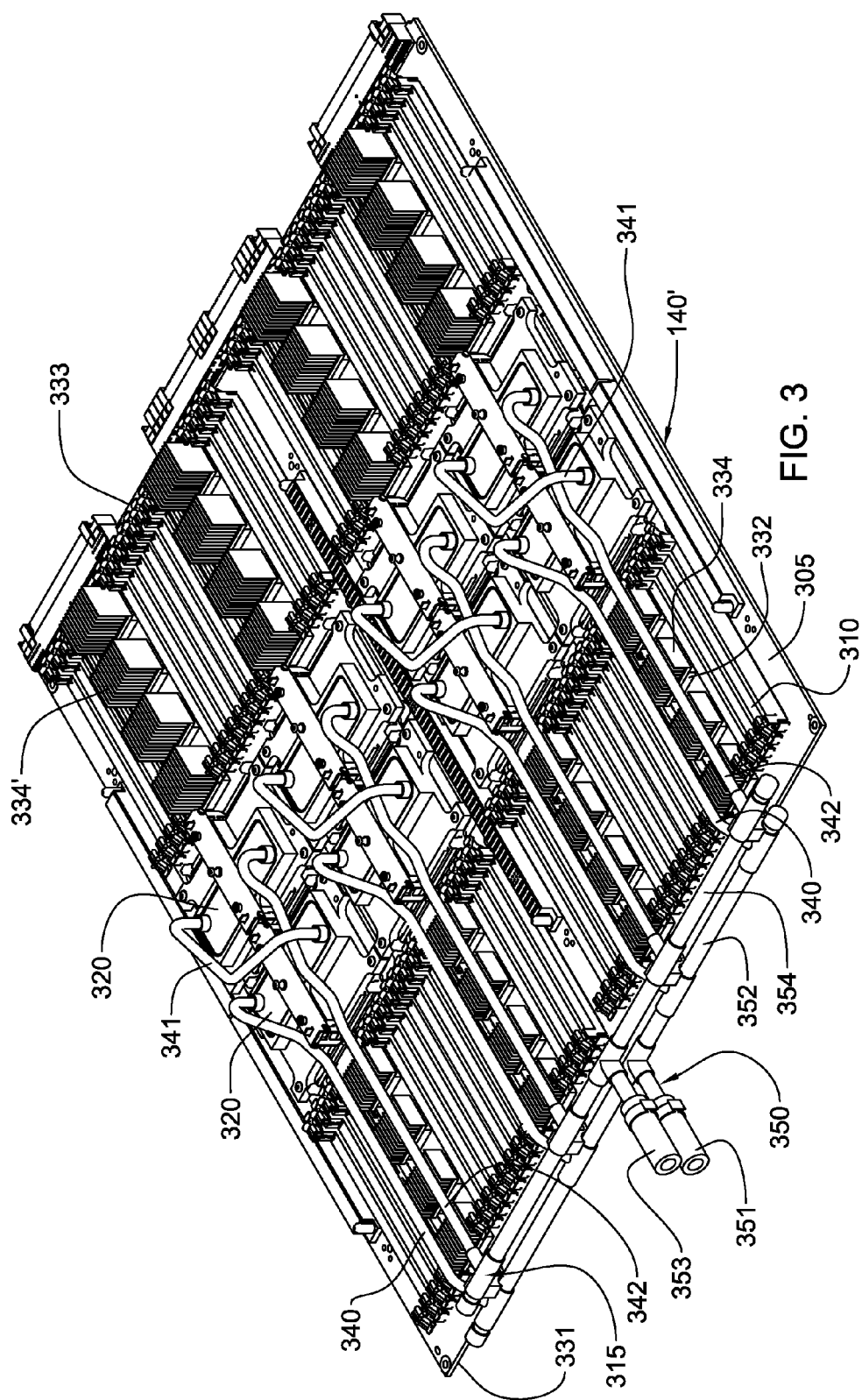

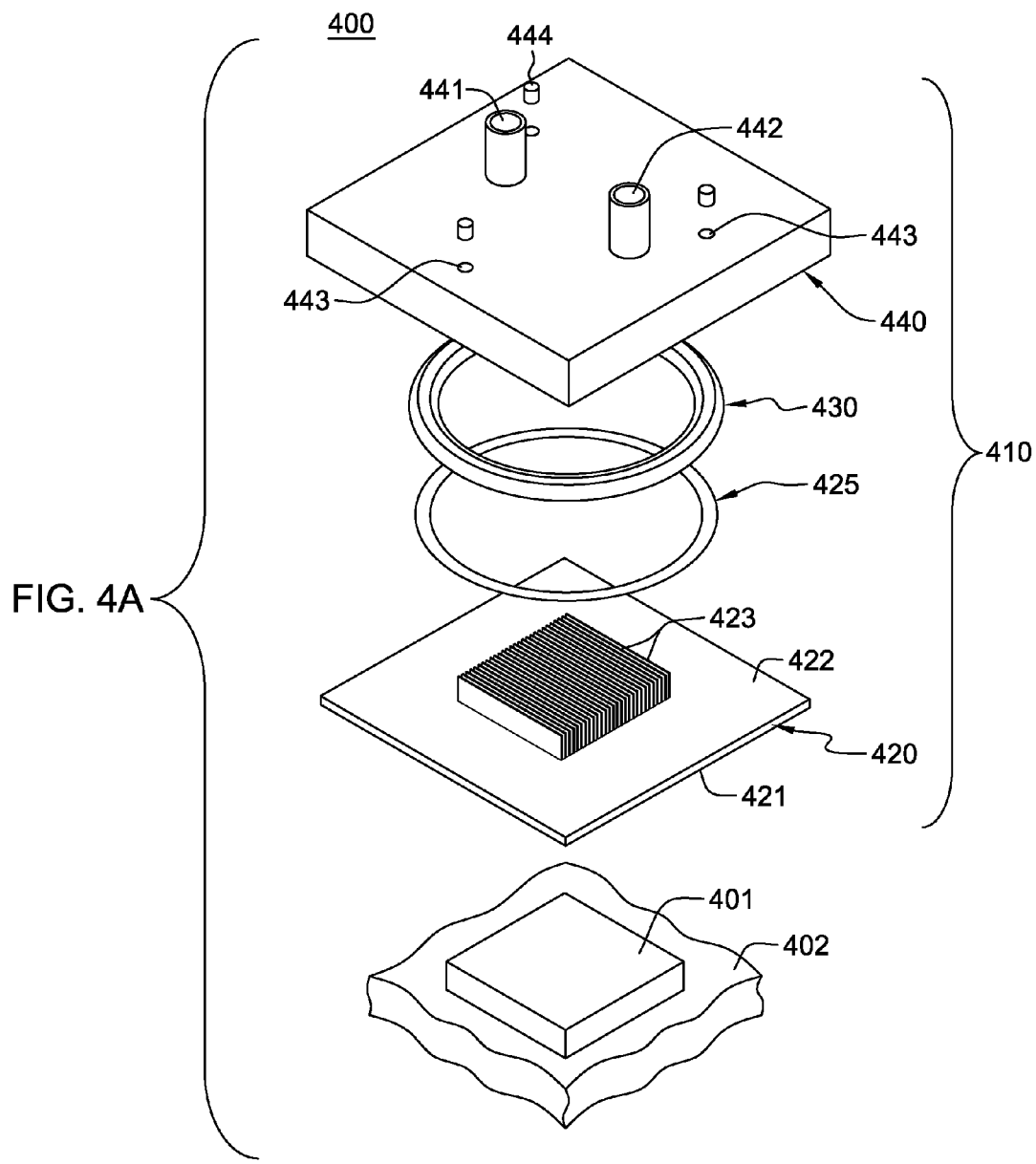

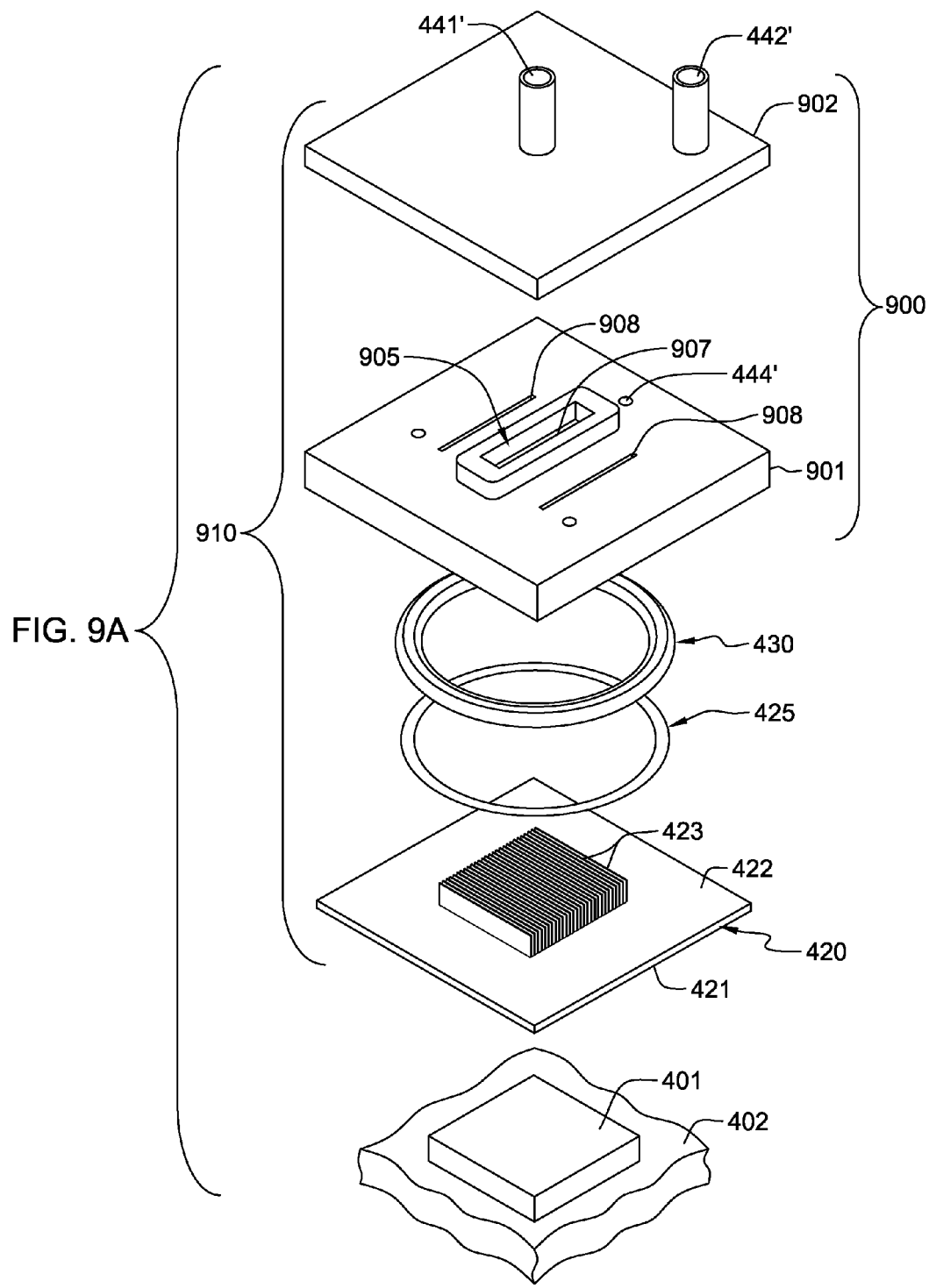

COMPOSITE HEAT SINK STRUCTURES

BACKGROUND

As is known, operating electronic components produce heat, which should be removed in an effective manner in order to maintain device junction temperatures within desirable limits, with failure to do so resulting in excessive component temperatures, potentially leading to thermal runaway conditions. Several trends in the electronics industry have combined to increase the importance of thermal management, including in technologies where thermal management has traditionally been less of a concern, such as complementary metal oxide semiconductor (CMOS) technologies. In particular, the need for faster and more densely packed circuits has had a direct impact on the importance of thermal management. For instance, power dissipation, and therefore heat production, increases as device operating frequencies increase. Also, increased operating frequencies may be possible at lower device junction temperatures. Further, as more and more components are packed onto a single chip, heat flux (Watts/cm$^2$) increases, resulting in the need to dissipate more power from a given size chip, module, or system. These trends have combined to create applications where traditional air cooling methods alone, such as methods using air cooled heat sinks with heat pipes or vapor chambers, are unable to remove sufficient heat.

The need to cool current and future high heat load, high heat flux electronic components thus mandates the continued development of more aggressive thermal management techniques using, for instance, liquid cooling. Various types of liquid coolants and liquid-cooling approaches are known, and provide different cooling capabilities. For instance, fluids such as refrigerants or other dielectric liquids (e.g., fluorocarbon liquids) exhibit lower thermal conductivity and specific heat properties, compared to liquids such as water or other aqueous fluids, but may be placed in direct physical contact with electronic components and their associated interconnects without adverse effects, such as corrosion or electrical short circuits. Other cooling liquids, such as water or other aqueous fluids, exhibit superior thermal conductivity and specific heat properties compared to dielectric fluids. However, water-based coolants must be separated from physical contact with the electronic components and interconnects, since corrosion and electrical short circuit problems are otherwise likely to result. This is typically accomplished by flowing the liquid coolant through a liquid-cooled heat sink or cold plate.

Various liquid-cold heat sink configurations have been disclosed in the art. Typically, a liquid-cooled heat sink is a thermally conductive structure, being fabricated completely of metal, and having one or more channels or passageways formed within the heat sink for flowing liquid coolant through the heat sink. Examples of such heat sinks are disclosed in commonly assigned, U.S. Pat. No. 7,751,918 B2, issued Jul. 6, 2010. Although very effective, such all-metal, liquid-cooled heat sinks could be relatively expensive to fabricate, as well as be relatively heavy, depending on the size of the electronic component(s) or assembly to be cooled. Thus, addressed herein, in part, is a goal of lowering heat sink structure costs, and providing lighter-weight heat sink structures for facilitating cooling of one or more electronic components of an electronic system.

BRIEF SUMMARY

In one aspect, provided herein is an apparatus which includes a composite heat sink structure. The composite heat sink structure includes: a thermally conductive base, having a main heat transfer surface to couple to at least one component to be cooled; a compressible, continuous sealing member; a sealing member retainer compressing the compressible, continuous sealing member against the thermally conductive base; and an in situ molded member molded over and affixed to the thermally conductive base, and molded over and securing in place the sealing member retainer, with a coolant-carrying compartment residing between the thermally conductive base and the in situ molded member; and a coolant inlet and a coolant outlet in fluid communication with the coolant-carrying compartment to facilitate liquid coolant flow therethrough.

Advantageously, the composite heat sink structures described herein comprise enhanced heat sink configurations, with good attachment and sealing between the thermally conductive base and the in situ molded member, which in one or more configurations, may be an in situ molded lid of the heat sink structure, or an in situ molded lower manifold member of a manifold structure of the composite heat sink structure. For instance, by molding the in situ molded member directly over and affixed to the thermally conductive base, a smaller overall footprint for the composite heat sink structure is achievable, that is, compared with a conventional approach requiring separate fasteners and openings offset from the main heat transfer area of the heat sink. Further, a smaller footprint in the Z direction is achieved by the in situ molding directly on the heat sink base. Still further, enhanced sealing along the heat sink base is achieved by the sealing member being compressibly secured against the thermally conductive base by the sealing member retainer during the in situ molding. By appropriately configuring and sizing the sealing member and the sealing member retainer, a desired compressive loading on the compressible, continuous sealing member may be readily achieved during the molding process, and maintained in the final composite heat sink structure.

In one or more embodiments, the thermally conductive base is fabricated of a different material from the in situ molded member. For instance, the thermally conductive base may include or be fabricated of a metal or metal alloy with good thermal transfer properties, such as copper or a copper alloy, and the in situ molded member may include or be fabricated of a less expensive material, such as a plastic material, or thermoplastic material. Advantageously, in these embodiments, the composite heat sink structure is less expensive to manufacture and lighter weight due to the use of the different component materials with, for instance, the heavier and more costly thermally conductive material only being employed in the thermally conductive base, where desired for efficient heat transfer performance of the composite heat sink structure.

As a further enhancement, the in situ molded member may comprise or be formed of a first plastic, and the sealing member retainer may comprise or be formed of a second plastic, which may be the same or different plastic materials. For instance, in certain embodiments, the first and second plastics are a same plastic or soluble plastics, and the in situ molded member is fused to the sealing member retainer, providing a good fluid-tight seal between the structures. For enhanced mechanical strength, the in situ molded member may be molded over the thermally conductive base to wrap around at least a portion of the thermally conductive base. For instance, the in situ molded member may be formed to wrap around at least a portion of the peripheral edge of the thermally conductive base by extending through one or more peripheral openings in the thermally conductive base.

Advantageously, in these configurations, the in situ molded member encloses one or more peripheral portions of the thermally conductive base, providing good mechanical coupling between the in situ molded member and thermally conductive base, while leaving the majority of the main heat transfer surface of the base exposed for good thermal coupling to the component(s) to be cooled. This advantageously ensures good structural integrity of the composite heat sink structure, notwithstanding internal pressures within the heat sink structure due to liquid coolant flow through the structure, and compression of the compressible, continuous sealing member between the sealing member retainer and the thermally conductive base.

In certain implementations, the in situ molded member is an in situ molded lid of the composite heat sink structure, with the coolant inlet and the coolant outlet being provided in the in situ molded lid. Further, the composite heat sink structure may include a plurality of thermally conductive fins disposed within the coolant-carrying compartment, for instance, extending from the thermally conductive base. Where present, the plurality of thermally conductive fins facilitates transfer of heat from the thermally conductive base to the liquid coolant flow through the coolant-carrying compartment. The coolant-carrying compartment may also include a coolant inlet manifold region in fluid communication with the coolant inlet, and a coolant outlet manifold region in fluid communication with the coolant outlet, where coolant within the coolant-carrying compartment flows from the coolant inlet manifold region between the plurality of thermally conductive fins, to the coolant outlet manifold region in a direction, at least in part, substantially parallel to the main heat transfer surface of the thermally conductive base. Advantageously, by in situ molding the lid over the thermally conductive base, both the attachment of the two structures together and the sealing of the two structures together is achieved in a more efficient and effective manner, resulting in a potentially smaller overall size for the composite heat sink structure, and thus a reduced cost to manufacture.

In certain further embodiments, the composite heat sink structure includes a manifold structure disposed over the thermally conductive base, with the manifold structure including an upper manifold member and a lower manifold member, and with the lower manifold member including or being the in situ molded member. In such a configuration, the manifold structure may include the coolant inlet and the coolant outlet, and at least one inlet orifice in fluid communication with the coolant inlet and the coolant-carrying compartment, and at least one outlet orifice in fluid communication with the coolant-carrying compartment and the coolant outlet, so that liquid coolant flows through the coolant inlet, the at least one inlet orifice, the coolant-carrying compartment, and the at least one outlet orifice, to the coolant outlet. In these embodiments, the at least one inlet orifice and at least one outlet orifice may be variously configured and positioned. For instance, the at least one inlet orifice may include at least one inlet slot positioned over a central region of the coolant-carrying compartment, and the at least one outlet orifice may include multiple outlet slots peripherally disposed over the coolant-carrying compartment so that liquid coolant flow introduced through the at least one inlet slot bifurcates, or otherwise divides, within the coolant-carrying compartment and flow outwards, at least in part, in a direction substantially parallel to the main heat transfer surface of the thermally conductive base.

As an additional enhancement, the sealing member retainer may fully cover the compressible, continuous sealing member and be provided with a continuous groove, within which the compressible, continuous sealing member resides, at least in part. Further, the thermally conductive base may also, or alternatively, include a continuous groove, with the compressible, continuous sealing member residing, at least in part, within the continuous groove of the thermally conductive base. In this manner, an enhanced, fluid-tight seal is achieved along the thermally conductive base, and in particular, between the thermally conductive base and the sealing member retainer using the compressible, continuous sealing member.

Advantageously, with the composite heat sink structures disclosed herein, various coolant-carrying compartment configurations may be provided, for instance, with different liquid coolant flow patterns through the coolant-carrying compartment(s), as desired for a particular application. For example, liquid coolant may be introduced into the coolant-carrying compartment to impinge upon the thermally conductive base in a central region of the compartment, and then bifurcate to flow outwards towards opposite peripheral regions thereof, before exiting the coolant-carrying compartment. Alternatively, the liquid coolant flow may be introduced at one side of the coolant-carrying compartment and flow substantially parallel to the main heat transfer surface, through the compartment, to another side of the coolant-carrying compartment, before exiting through the in situ molded member. Further, various configurations of thermally conductive fins, such as thermally conductive plate fins or thermally conductive pin fins, may be employed within the coolant-carrying compartment to facilitate transfer of heat from one or more components being cooled, such as one or more electronic components, to the liquid coolant flow passing through the composite heat sink structure.

In another aspect, an apparatus is provided which includes at least one electronic component, and a composite heat sink structure coupled to the at least one electronic component. The composite heat sink structure includes: a thermally conductive base, the thermally conductive base including a main heat transfer surface coupled to the at least one electronic component; a compressible, continuous sealing member; a sealing member retainer compressing the compressible, continuous sealing member against the thermally conductive base; an in situ molded member molded over and affixed to the thermally conductive base, and molded over and securing in place the sealing member retainer, and with a coolant-carrying compartment residing between the thermally conductive base and the in situ molded member; and a coolant inlet and a coolant outlet, the coolant inlet and coolant outlet being in fluid communication with the coolant-carrying compartment to facilitate liquid coolant flow therethrough.

In a further aspect, a method is provided which includes forming a composite heat sink structure. Forming the composite heat sink structure includes: obtaining a thermally conductive base, the thermally conductive base including a main heat transfer surface to couple to at least one component to be cooled; placing a compressible, continuous sealing member on the thermally conductive base; disposing a sealing member retainer over the compressible, continuous sealing member to compress the compressible, continuous sealing member against the thermally conductive base; and in situ forming a molded member over and affixed to the thermally conductive base, the in situ molded member being molded over and securing in place the sealing member retainer, wherein a coolant-carrying compartment resides between the thermally conductive base and the in situ molded member, and the compressible, continuous sealing member provides the composite heat sink structure with a fluid-tight seal.

Additional features and advantages are realized through the structures and methods of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 3 depicts one detailed embodiment of a partially assembled electronic system layout, wherein the electronic system includes eight heat-generating electronic components to be cooled, each having, in one embodiment, a respective liquid-cooled heat sink associated therewith, in accordance with one or more aspects of the present invention;

FIG. 4A depicts an exploded view of one embodiment of an apparatus comprising one or more electronic components to be cooled, and a composite heat sink structure, in accordance with one or more aspects of the present invention;

FIG. 9A depicts an exploded view of a further embodiment of an apparatus comprising one or more electronic components to be cooled, and a composite heat sink structure, in accordance with one or more aspects of the present invention;

DETAILED DESCRIPTION

Figure 1:
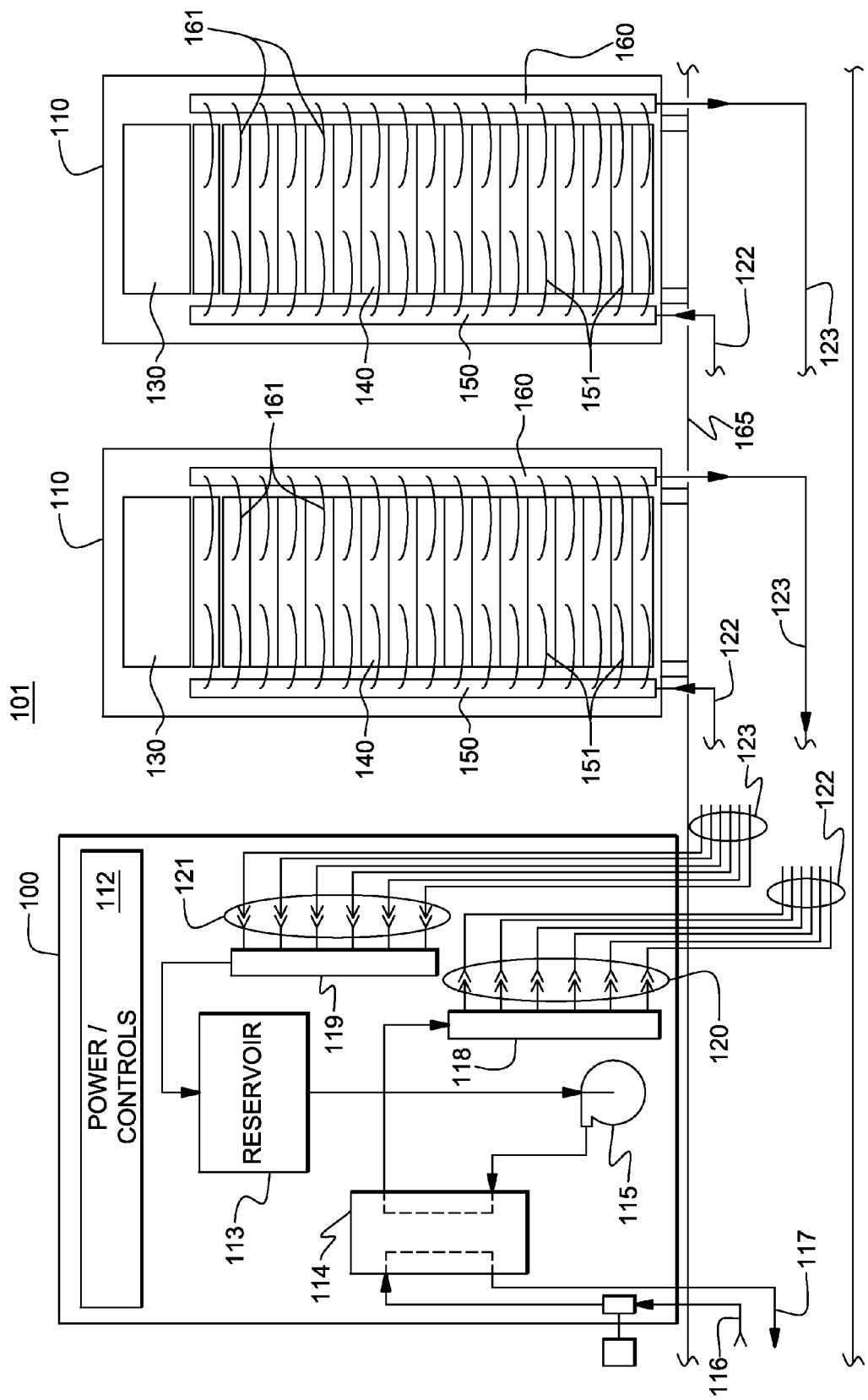
FIG. 1 depicts one embodiment of an at least partially liquid-cooled data center comprising a coolant distribution unit which facilitates liquid-cooling of electronics racks of the data center, in accordance with one or more aspects of the present invention.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high, mid or low end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system within an electronics rack may be movable or fixed relative to the electronics rack, with rack-mounted electronic drawers being one example of electronic systems of an electronics rack to be cooled.

"Electronic component" refers to any heat-generating electronic component of, for example, a computer system or other electronics unit requiring cooling. By way of example, an electronic component may comprise one or more packaged or unpackaged integrated circuit die (or chips), such as processor chips, and/or other electronic devices to be cooled, including one or more memory chips, memory support chips, etc.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of the coolants discussed herein, such as the facility coolant or system coolant, is water. However, the cooling concepts disclosed below are readily adapted to use with other types of coolant on the facility side and/or the system side. For example, one or more of the coolants may comprise an aqueous-based liquid, such as a brine, or a dielectric liquid, such as a fluorocarbon liquid, a hydrofluoroether liquid, a liquid metal, or other similar coolant, or refrigerant, while still maintaining the advantages and unique features of the present invention.

Reference is made below to the drawings, which are not drawn to scale for ease of understanding, where the same or similar reference numbers used throughout different figures designate the same or similar components.

In one embodiment, an air-cooled data center may have a raised floor layout, with multiple electronics racks disposed in one or more rows. Such a data center may house several hundred, or even several thousand microprocessors. In one implementation, chilled air enters the computer room via perforated floor tiles from a supply air plenum defined between the raised floor and a base or sub-floor of the room. Cooled air is taken in through louvered covers at air inlet sides of the electronics racks and expelled through the back (i.e., air outlet sides) of the electronics racks. The electronics racks may have one or more air moving devices (e.g., axial or centrifugal fans) to provide forced inlet-to-outlet airflow to cool the components within the system(s) of the rack. The supply air plenum provides cooled air to the air-inlet sides of the electronics racks via perforated floor tiles disposed in a "cold" aisle of the data center. The cooled air is supplied to the under-floor plenum by one or more computer room air-conditioning (CRAC) units, also disposed within the data center. Room air is taken into each air-conditioning unit typically near an upper portion thereof. This room air may comprise in part exhausted air from the "hot" aisles of the data center defined, for example, by opposing air outlet sides of the electronics racks.

Figure 2:
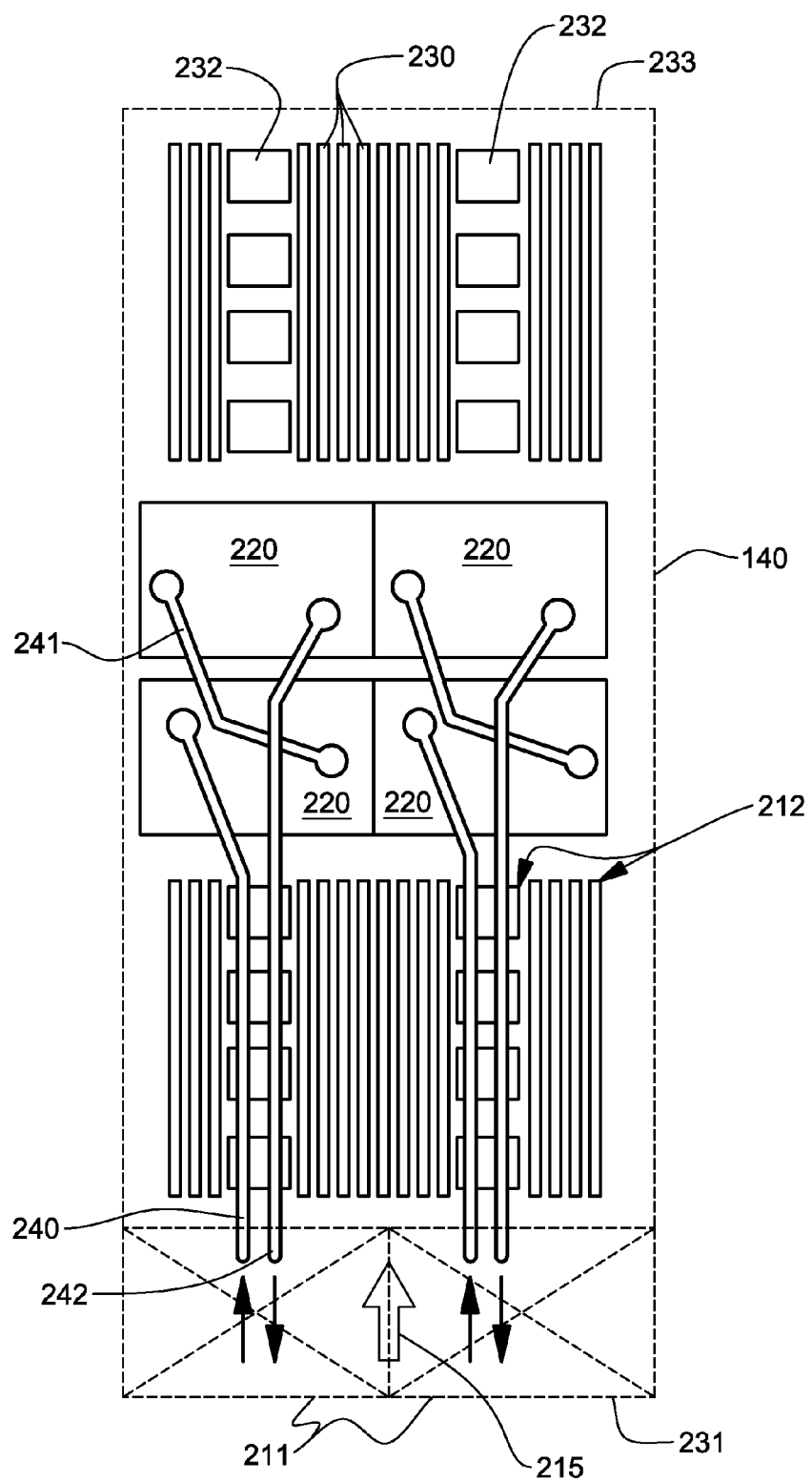
FIG. 2 is a plan view of one embodiment of an electronic system (or node) layout illustrating an air and liquid cooling apparatus for cooling components of the electronic system, in accordance with one or more aspects of the present invention.

Due to the ever-increasing airflow requirements through electronics racks, and the limits of air distribution within the typical data center installation, liquid-based cooling may be combined with, or used in place of, conventional air-cooling. FIGS. 1-3 illustrate one embodiment of a data center implementation employing a liquid-based cooling system with one or more liquid-cooled heat sinks coupled to, for instance, high heat-generating electronic components disposed within one or more electronics racks.

Referring first to FIG. 1, one embodiment of a data center 101 comprising a coolant distribution unit 100, is depicted. The coolant distribution unit 100 may be a relatively large unit which occupies what would be considered a full electronics frame. Within coolant distribution unit 100 is a power/control element 112, a reservoir/expansion tank 113, a heat exchanger 114, a pump 115 (possibly accompanied by a redundant pump), facility coolant inlet 116 and outlet 117 supply pipes, a supply manifold 118 supplying system coolant to the electronics racks 110 via couplings 120 and lines 122, and a return manifold 119 receiving system coolant from the electronics racks 110, via lines 123 and couplings 121. The electronics racks may include (in one example) a power/control unit 130 for the rack, multiple electronic systems 140, a system coolant supply manifold 150, and a system coolant return manifold 160. As shown, the electronics racks 110 may be disposed on a raised floor 165 of the data center 101, with lines 122 providing system coolant to system coolant supply manifolds 150 and lines 123 facilitating return of system coolant from system coolant return manifolds 160 being disposed in the supply air plenum beneath the raised floor.

In the embodiment illustrated, system coolant supply manifold 150 provides system coolant to the cooling systems of the electronic systems (such as to liquid-cooled heat sinks thereof) via flexible hose connections 151, which are disposed between the supply manifold and the respective electronic systems within the rack. Similarly, system coolant return manifold 160 is coupled to the electronic systems via flexible hose connections 161. Quick connect couplings may be employed at the interface between flexible hoses 151, 161 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 110 may also include an air-to-liquid heat exchanger disposed, for instance, at an air outlet side thereof, which also receives system coolant from the system coolant supply manifold 150 and returns system coolant to the system coolant return manifold 160.

FIG. 2 depicts one embodiment of an electronic system 140 component layout, wherein one or more air moving devices 211 provide forced air flow 215 to cool multiple components 212 within electronic system 140. Cool air is taken in through a front 231 and exhausted out a back 233 of the system. The multiple components to be cooled include multiple processor modules to which liquid-cooled heat sinks 220 (of a liquid-based cooling system) are coupled, as well as multiple arrays of memory modules 230 (e.g., dual in-line memory modules (DIMMs)) and multiple rows of memory support modules 232 (e.g., DIMM control modules) to which air-cooled heat sinks may be coupled. In the embodiment illustrated, memory modules 230 and the memory support modules 232 are partially arrayed near front 231 of electronic system 140, and partially arrayed near back 233 of electronic system 140. Also, in the embodiment of FIG. 2, memory modules 230 and the memory support modules 232 are cooled by air flow 215 across the electronic system.

The illustrated liquid-based cooling system further includes multiple coolant-carrying tubes connected to and in fluid communication with liquid-cooled heat sinks 220. The coolant-carrying tubes comprise sets of coolant-carrying tubes, with each set including (for example) a coolant supply tube 240, a bridge tube 241 and a coolant return tube 242. By way of example only, the set of tubes provide liquid coolant to a series-connected pair of heat sinks 220 (coupled to a pair of processor modules). Coolant flows into a first heat sink of a pair via the coolant supply tube 240 and from the first heat sink to a second heat sink of the pair via bridge tube or line 241, which may or may not be thermally conductive. From the second heat sink of the pair, coolant is returned through the respective coolant return tube 242. Note that in an alternate implementation, one or more of the liquid-cooled heat sinks 220 could be coupled directly to a respective coolant supply tube 240 and coolant return tube 242, that is, without series connecting two or more of the liquid-cooled heat sinks.

By way of further explanation, FIG. 3 depicts an alternate electronic system layout comprising eight processor modules, each having a respective liquid-cooled heat sink of a liquid-based cooling system coupled thereto. The liquid-based cooling system is shown to further include associated coolant-carrying tubes for facilitating passage of liquid coolant through the liquid-cooled heat sinks and a header subassembly to facilitate distribution of liquid coolant to and return of liquid coolant from the liquid-cooled heat sinks. By way of specific example, the liquid coolant passing through the liquid-based cooling subsystem may be cooled and conditioned (e.g., filtered) water.

More particularly, FIG. 3 is an isometric view of one embodiment of an electronic system or drawer, and a cooling system. The depicted planar server assembly includes a multi-layer printed circuit board to which memory DIMM sockets and various electronic components to be cooled may be attached both physically and electrically. In the cooling system depicted, a supply header is provided to distribute liquid coolant from an inlet to multiple parallel coolant flow paths and a return header collects exhausted coolant from the multiple parallel coolant flow paths into an outlet. Each parallel coolant flow path may include one or more heat sinks in series flow arrangement to facilitate cooling one or more electronic components to which the heat sinks are coupled. The number of parallel paths and the number of series-connected liquid-cooled heat sinks may depend, for example, on the desired component temperature, available coolant temperature and coolant flow rate, and the total heat load being dissipated from the electronic components.

More particularly, FIG. 3 depicts one embodiment of a partially assembled electronic system 140' and an assembled liquid-based cooling system 315 coupled to primary heat-generating components (such as processor die or electronic modules) to be cooled. In this embodiment, the electronic system is configured for (or as) a node of an electronics rack, and includes, by way of example, a support substrate or planar board 305, a plurality of memory module sockets 310 (with the memory modules (e.g., dual in-line memory modules) not shown), multiple rows of memory support modules 332 (each having coupled thereto an air-cooled heat sink 334), and multiple processor modules (not shown) disposed below the liquid-cooled heat sinks 320 of the liquid-based cooling system 315.

In addition to liquid-cooled heat sinks 320, liquid-based cooling system 315 includes multiple coolant-carrying tubes, including coolant supply tubes 340 and coolant return tubes 342 in fluid communication with respective liquid-cooled heat sinks 320. The coolant-carrying tubes 340, 342 are also connected to a header (or manifold) subassembly 350 which facilitates distribution of liquid coolant to the coolant supply tubes and return of liquid coolant from the coolant return tubes 342. In this embodiment, the air-cooled heat sinks 334 coupled to memory support modules 332 closer to front 331 of electronic system 140' are shorter in height than the air-cooled heat sinks 334' coupled to memory support modules 332 near back 333 of electronic system 313. This size difference is to accommodate the coolant-carrying tubes 340, 342 since, in the depicted embodiment, the header subassembly 350 is at the front 331 of the electronics system and the multiple liquid-cooled heat sinks 320 are in the middle.

Liquid-based cooling system 315 comprises, in one embodiment, a pre-configured monolithic structure which includes multiple (pre-assembled) liquid-cooled heat sinks 320 configured and disposed in spaced relation to engage respective heat-generating electronic components. Each liquid-cooled heat sink 320 includes, in one embodiment, a liquid coolant inlet and a liquid coolant outlet, as well as an attachment subassembly (i.e., a heat sink/load arm assembly). Each attachment subassembly is employed to couple its respective liquid-cooled heat sink 320 to the associated electronic component to form the heat sink and electronic component (or device) assemblies depicted. Alignment openings (i.e., thru-holes) may be provided on the sides of the heat sink to receive alignment pins or positioning dowels during the assembly process. Additionally, connectors (or guide pins) may be included within the attachment subassembly to facilitate use of the attachment assembly.

As shown in FIG. 3, header subassembly 350 may include two liquid manifolds, i.e., a coolant supply header 352 and a coolant return header 354, which in one embodiment, may be mechanically coupled together via supporting brackets.

In a monolithic cooling structure example, the coolant supply header 352 may be metallurgically bonded in fluid communication to each coolant supply tube 340, while the coolant return header 354 is metallurgically bonded in fluid communication to each coolant return tube 352. By way of example, a single coolant inlet 351 and a single coolant outlet 353 extend from the header subassembly for coupling to the electronics rack's coolant supply and return manifolds, such as shown in FIG. 1.

In one embodiment only, the coolant supply tubes 340, bridge tubes 341 and coolant return tubes 342 in the exemplary embodiment of FIG. 3 may be pre-configured, semi-rigid tubes formed of a thermally conductive material, such as copper or aluminum, and the tubes may be respectively brazed, soldered or welded in a fluid-tight manner to the header subassembly and/or the liquid-cooled heat sinks. The tubes are pre-configured for a particular electronics system to facilitate installation of the monolithic structure in engaging relation with one or more selected components of the electronic system.

In one or more embodiments, the liquid-cooled heat sink(s) of a cooling system, such as described above, may be completely formed of a thermally conductive, metal material, such as copper or aluminum. While effective in assisting cooling of selected electronic components, existing metal-based designs of liquid-cooled heat sinks can be relatively expensive to produce, and heavy in implementation. Further, existing liquid-cooled heat sink configurations are often fabricated with a larger footprint than cooling requirements dictate, to allow space for connecting together the different components of the heat sink. To address these issues, disclosed below with reference to FIGS. 4A-9D, are enhanced, composite heat sink structures, which are smaller, less expensive to fabricate, and lighter-weight structures.

In general, disclosed herein are apparatuses which include a composite heat sink structure, that is, a composite, liquid-cooled heat sink, having a thermally conductive base, a compressible, continuous sealing member, a sealing member retainer, an in situ molded member, and a coolant inlet and coolant outlet. The thermally conductive base includes a main heat transfer surface configured to couple to at least one component to be cooled, such as one or more electronic components. The sealing member retainer contacts and compresses the compressible, continuous sealing member against the thermally conductive base to form a fluid-tight seal along the thermally conductive base, and the in situ molded member is molded over and affixed to the thermally conductive base, and is molded over and secures in place the sealing member retainer. A coolant-carrying compartment resides between the thermally conductive base and the in situ molded member, and the compressible, continuous sealing member, in one or more embodiments, encircles the coolant-carrying compartment to provide the fluid-tight seal around the coolant-carrying compartment. In one or more embodiments, the continuous sealing member is, or comprises, an O-ring. The coolant inlet and the coolant outlet are in fluid communication with the coolant-carrying compartment to facilitate liquid coolant flow through the compartment.

In one or more embodiments, the thermally conductive base and the in situ molded member are fabricated of different materials. For instance, the thermally conductive base may be fabricated of a metal, such as copper or aluminum, or a metal alloy, such as a copper or aluminum alloy, and the in situ molded member may be fabricated of a plastic material. In certain embodiments, the plastic material may comprise a thermoplastic, such as: Polyethylene (PE), Polypropylene (PP), Polyvinyl Chloride (PVC), Polytetrafluoroethylene (PTFE), Polyether Ether Keytone (PEEK), etc. Further, in one or more embodiments, the sealing member retainer also comprises a plastic material, and may be the same or a different plastic material from the in situ molded member. In certain advantageous embodiments, the plastic material of the sealing member retainer and the in situ molded member are the same or comprise soluble materials, so that the in situ molded member fuses to the sealing member retainer during molding of the member over the thermally conductive base and sealing member retainer.

In one or more implementations, mechanical strength of the composite heat sink structure is enhanced by wrapping the in situ molded member in part around the thermally conductive base, for instance, at least around corner edges of the thermally conductive base. For instance, mechanical strength can be enhanced by providing one or more peripheral openings through the thermally conductive base, and filling (at least in part) the one or more peripheral openings with the in situ molded member such that the in situ molded member extends through the opening(s) and encircles one or more portions of the thermally conductive base, that is, one or more portions between respective peripheral openings and the edge of the thermally conductive base. Note that the main heat transfer surface of the thermally conductive base remains substantially uncovered by the in situ molded member to allow for good thermal coupling between the base and the component(s) to be cooled.

In certain embodiments, the in situ molded member is an in situ molded lid of the composite heat sink structure, and the in situ molded lid includes the coolant inlet and the coolant outlet. Further, a plurality of thermally conductive fins may be provided within the coolant-carrying compartment to facilitate transfer of heat from the thermally conductive base to the liquid coolant flowing through the coolant-carrying compartment. The coolant-carrying compartment may include a coolant inlet manifold region in fluid communication with the coolant inlet, and a coolant outlet manifold region in fluid communication with the coolant outlet, where coolant within the coolant-carrying compartment flows from the coolant inlet manifold region, between the plurality of thermally conductive fins, to the coolant outlet manifold region.

In certain other embodiments, the composite heat sink structure includes a manifold structure disposed over the thermally conductive base, with the manifold structure including an upper manifold member and a lower manifold member, and with the lower manifold member being, or comprising, the in situ molded member. In this configuration, the manifold structure may include the coolant inlet and the coolant outlet, and at least one inlet orifice in fluid communication with the coolant inlet and the coolant-carrying compartment, and at least one outlet orifice in fluid communication with the coolant-carrying compartment and the coolant outlet, wherein liquid coolant flows through the coolant inlet, the at least one inlet orifice, the coolant-carrying compartment, and the at least one outlet orifice, to the coolant outlet. Advantageously, in this configuration, the at least one inlet orifice and at least one outlet orifice may be variously positioned or configured, with any number of inlet and outlet orifices being provided, as desired for a particular implementation. For instance, the at least one inlet orifice may include at least one inlet slot positioned over a central region of the coolant-carrying compartment, with the at least one inlet slot facilitating the liquid coolant flow into the coolant-carrying compartment in the central region of the compartment. In combination with multiple outlet orifices along the periphery of the coolant-carrying compartment, the liquid coolant flow introduced through the at least one inlet slot divides, for instance, bifurcates, upon contact with the thermally conductive base to flow outwards, for example, between a plurality of thermally conductive fins, to the periphery for exhausting through the multiple peripheral outlet orifices.

By way of example, where present, the plurality of thermally conductive fins within the heat sink structure could comprise a plurality of parallel-disposed, thermally conductive plate fins, which define channels between the fins, into which the coolant is introduced and flows, for example, from a central region of the coolant-carrying compartment, outwards towards a peripheral region of the coolant-carrying compartment, or from a first side to a second side of the composite heat sink structure, in a direction substantially parallel to the main heat transfer surface of the thermally conductive base.

In one or more embodiments, the sealing member retainer may be a continuous sealing member retainer with a continuous groove into which the compressible, continuous sealing member resides, at least in part. In addition, or alternatively, the thermally conductive base may comprise a continuous groove in a second side of the base, opposite from a first side containing the main heat transfer surface of the thermally conductive base, and the compressible, continuous sealing member also (or alternatively) may reside, at least in part, within the continuous groove in the second side of the thermally conductive base.

By way of example, FIGS. 4A-4D depict one embodiment of an apparatus 400, in accordance with one or more aspects of the present invention. As illustrated, in this embodiment, apparatus 400 includes one or more electronic components 401 (FIG. 4A), and a composite heat sink structure 410 (shown in exploded view in FIG. 4A). The one or more electronic components 401 may be disposed, for instance, on a supporting substrate 402, which may facilitate electrical connection of the electronic component(s) to other components of an electronic system.

Referring collectively to FIGS. 4A-4D, composite heat sink structure 410 includes, for instance, a thermally conductive base 420, a compressible, continuous sealing member 425, a sealing member retainer 430, and an in situ molded member 440.

In the depicted embodiment, thermally conductive base 420 (which is the active cooling portion, or heat transfer portion, of the heat sink structure) is rectangular-shaped, by way of example only, and has a smaller footprint than the in situ molded member 440, with the in situ molded member wrapping, in part, around the periphery of the thermally conductive base 420 (as explained further below), for enhanced mechanical strength of the composite heat sink structure 410. In one or more embodiments, the thermally conductive base and in situ molded member are formed of different materials, with the thermally conductive base being fabricated of a good thermal conductor, such as a metal, for instance, copper or aluminum, or a metal alloy, such as a copper or aluminum alloy, and the in situ molded member being fabricated of a different, less expensive, and less thermally conductive material, such as, for instance, a thermoplastic. By way of example, the thermoplastic could comprise Polyethylene (PE), Polypropylene (PP), Polyvinyl Chloride (PVC), Polytetrafluoroethylene (PTFE), Polyether Ether Keytone (PEEK), etc. In one or more implementations, the sealing member retainer 430 may also be fabricated of plastic, and may be chosen such that the in situ molded member bonds well to the sealing member retainer during the molding process. For instance, the sealing member retainer may be formed of a same plastic material as the in situ molded member, or a plastic material soluble with the plastic material of the in situ molded member, such that the molded member fuses to the sealing member retainer during the in situ molding process, and thereby forms a strong fluid-tight bond between the molded member and the sealing member retainer.

Thermally conductive base 420 includes a main heat transfer surface 421, sized and configured to couple to electronic component(s) 401 to be cooled. By way of example, main heat transfer surface 421 may be a flat, lower surface of a base plate 422 of thermally conductive base structure 420, which is appropriately sized to couple and substantially cover the electronic component(s) to be cooled. Further, a plurality of thermally conductive fins 423 may extend, in one embodiment, from base plate 422 of thermally conductive base 420. In the depicted embodiment, the plurality of thermally conductive fins 423 comprise a plurality of thermally conductive plate fins oriented substantially parallel, with channels defined between adjacent thermally conductive plate fins.

Figure 4B:
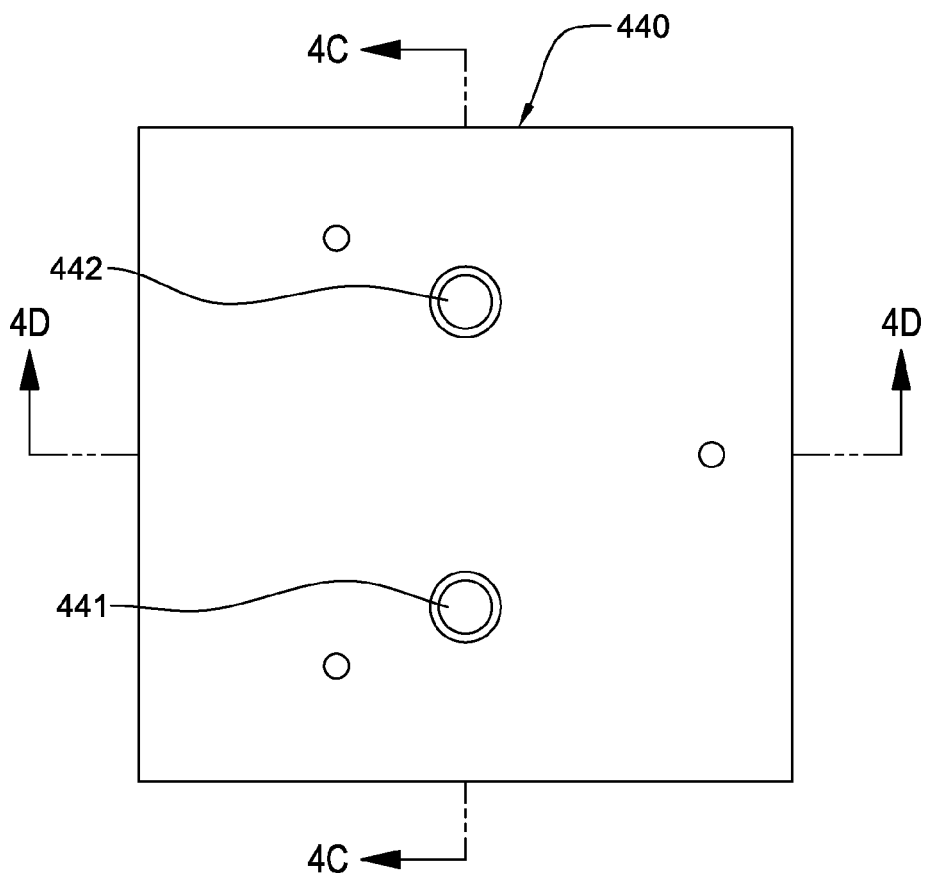
FIG. 4B is a plan view of the composite heat sink structure of FIG. 4A, in accordance with one or more aspects of the present invention.
Figure 4C:
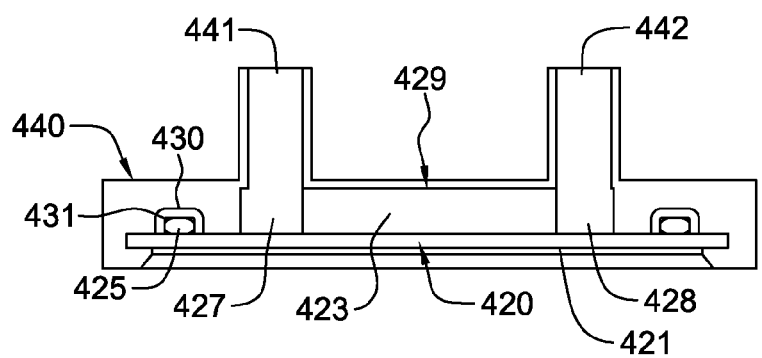
FIG. 4C is a cross-sectional elevational view of the composite heat sink structure of FIG. 4B, taken along line 4C-4C thereof, in accordance with one or more aspects of the present invention.
Figure 4D:
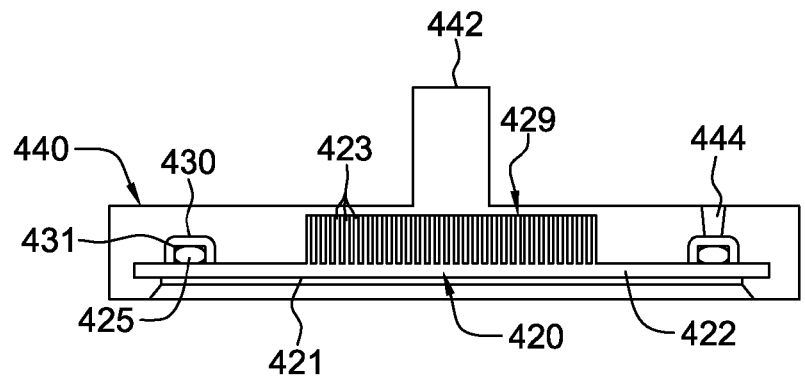
FIG. 4D is a cross-sectional elevational view of the composite heat sink structure of FIG. 4B, taken along line 4D-4D thereof, in accordance with one or more aspects of the present invention.
Figure 4E:
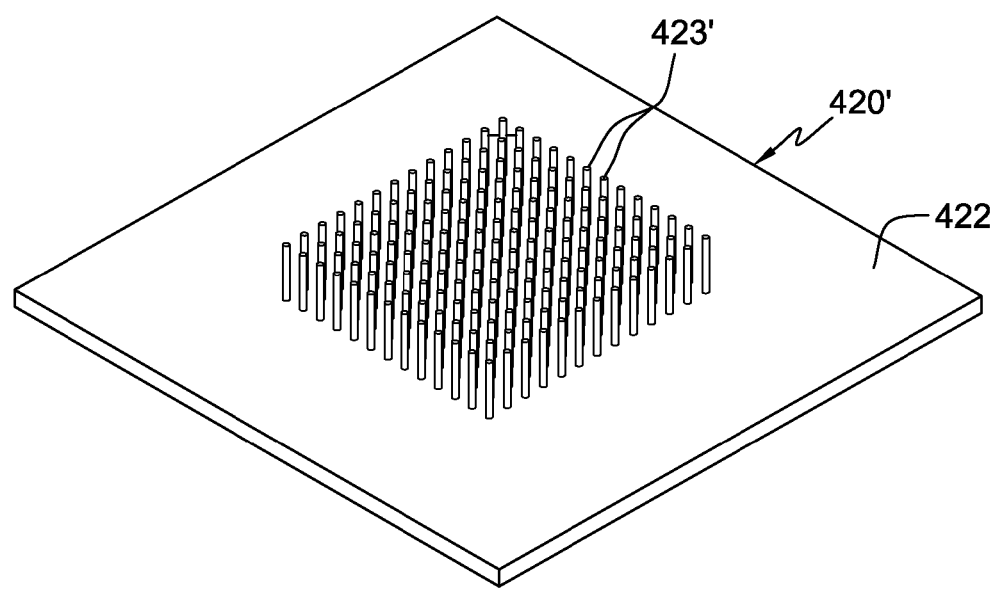
FIG. 4E illustrates an alternate embodiment of a thermally conductive base which may be employed in a composite heat sink structure and apparatus, such as depicted in FIGS. 4A-4D, in accordance with one or more aspects of the present invention.

As illustrated, in one embodiment, the compressible, continuous sealing member 425, such as a compressible O-ring, encircles the plurality of thermally conductive fins 423 and resides, in one embodiment, within a groove 431 formed within sealing member retainer 430. Note that the circular shapes of compressible, continuous sealing member 425 and sealing member retainer 430 are provided by way of example only, and that other configurations may be employed as desired for a particular implementation. As illustrated in FIGS. 4C & 4D, the sealing member retainer 430 and continuous groove 431 are configured in this example to allow the sealing member retainer 430 to apply a force against compressible, continuous sealing member 425, compressing compressible, continuous sealing member 425 against thermally conductive base 420, to form a good fluid-tight seal between the compressible, continuous sealing member 425 and the thermally conductive base 420. As illustrated, the sealing member retainer is secured in place by the in situ molded member 440 molded over the thermally conductive base 420 and sealing member retainer 430.

During the molding process, sealing member retainer 430 may be held in position, compressing compressible, continuous sealing member 425 against thermally conductive base 420 via multiple retaining pins, as explained further below with reference to the fabrication examples of FIGS. 5-8H. The holes 443 resulting from the retaining pins (now shown) may be sealed using, for instance, an epoxy or a plastic insert 444, etc., as desired for a particular implementation. Note that, in this example, thermally conductive base 420 and in situ molded member 440 together define a coolant-carrying compartment 429 (FIGS. 4C & 4D), through which liquid coolant flows, at least in part, in a direction substantially parallel to main heat transfer surface 421 of thermally conductive base 420. Coolant-carrying compartment 429 within the composite heat sink structure may include a coolant inlet manifold region 427 and a coolant outlet manifold region 428, and could be configured as one or more chambers, channels, passageways, etc., depending on the requirements of the particular heat removal implementation. Further, coolant-carrying compartment 429 is a fluid-tight compartment through which liquid coolant flows between a coolant inlet 441 and a coolant outlet 442 of the composite heat sink structure 410, and more particularly, of the in situ molded member 440. Note that coolant inlet 441 and coolant outlet 442 are illustrated tubular-shaped, as one example only. The coolant inlet and outlet may be fabricated to include, for instance, hose barbs, threaded connections (e.g., SAE, NPT), tube sockets, etc., for joining the coolant inlet and coolant outlet to respective conduits of an associated cooling system, such as the exemplary systems described above in connection with FIGS. 1-3. Note also that the in situ molded member 440 may be in situ molded to the thermally conductive base in any desired configuration using, for instance, one or more of fabrication approaches discussed below.

Note further that other configurations and arrays of thermally conductive fins may be employed. For instance, reference FIG. 4E, where a thermally conductive base 420' is depicted substantially identical to thermally conductive base 420 of FIGS. 4A-4D, but with an array of thermally conductive pin fins 423' extending from base plate 422, rather than a plurality of parallel-disposed, thermally conductive plate fins, as in the example of FIGS. 4A-4D. Other thermally conductive fin configurations and other fin array footprints may be employed, as desired. Further, composite heat sink structures may be formed in accordance with the concepts disclosed herein without the presence of thermally conductive fins within the coolant-carrying compartment(s).

As illustrated in FIGS. 4A-4D, the composite heat sink structure is characterized, at least in part, by the in situ molded member being molded in place over the thermally conductive base, resulting in minimizing the profile of the composite heat sink structure and, for instance, eliminating the need for separate mechanical fasteners to secure a lid or manifold structure to the thermally conductive base. Further, the composite heat sink structure includes a compressible, continuous sealing member which is compressed against the thermally conductive base by a sealing member retainer, held in position during the in situ molding process, with the resultant in situ molded member being molded over, in part, the sealing member retainer and securing the retainer in place, so that a good fluid-tight seal is formed between the structures around the periphery of the coolant-carrying compartment. Advantageously, the composite heat sink structure provides enhanced sealing between the components of the structure to ensure coolant leakage does not occur, notwithstanding that the thermally conductive base and in situ molded member are fabricated of different materials. The provision of an in situ molded member over the thermally conductive base facilitates forming a more compact heat sink structure compared, for instance, with an implementation where the components of the heat sink structure are coupled together along the periphery of the structure using separate mechanical fasteners.

Figure 5:
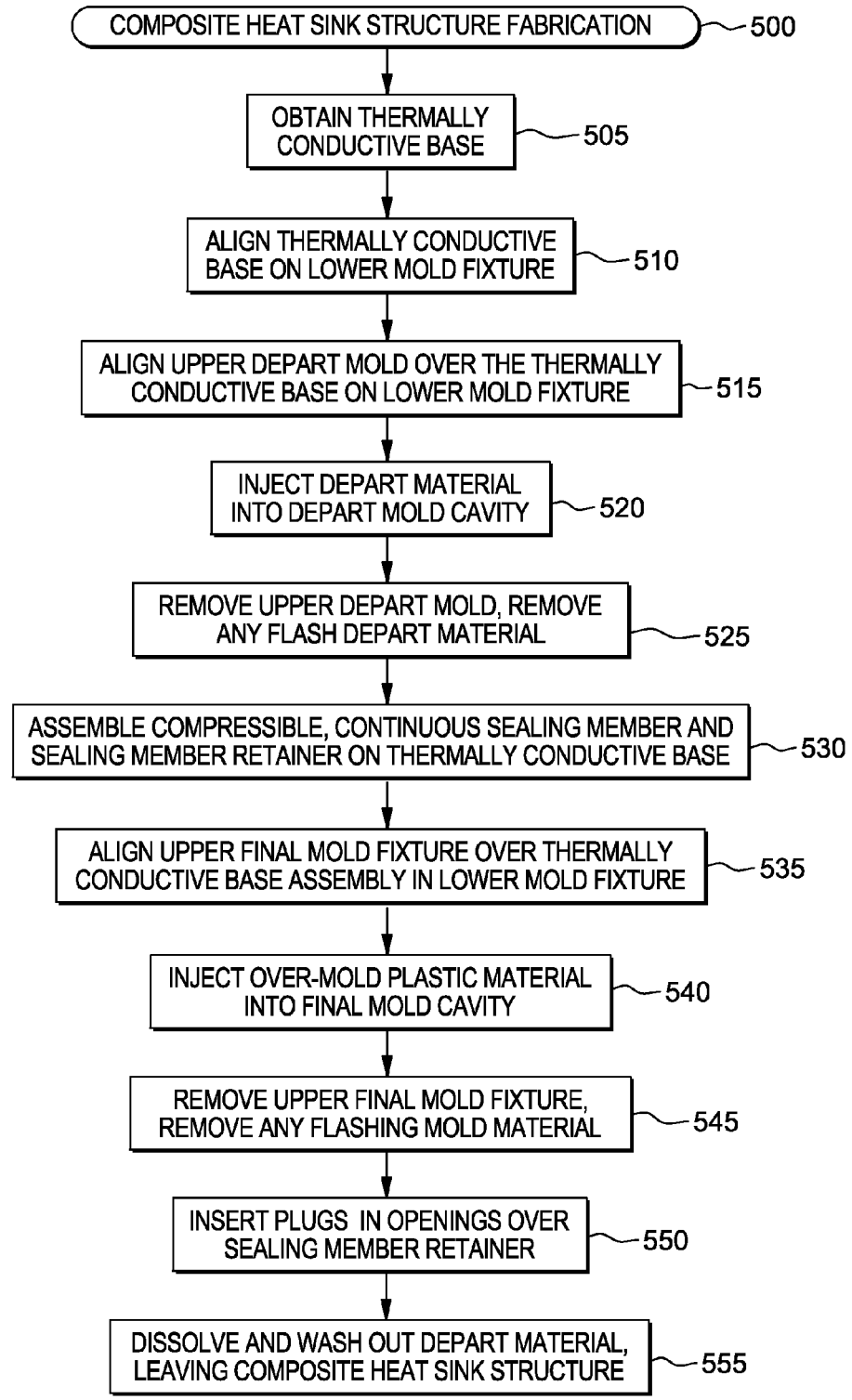
FIG. 5 is a flowchart of one embodiment of a process of fabricating a composite heat sink structure, in accordance with one or more aspects of the present invention.

FIG. 5 depicts a flowchart of one embodiment of a composite heat sink structure fabrication process, in accordance with one or more aspects of the present invention. The fabrication process of FIG. 5 is described hereinbelow with reference to the exemplary composite heat sink structure of FIGS. 6A-6I.

Figure 6A:
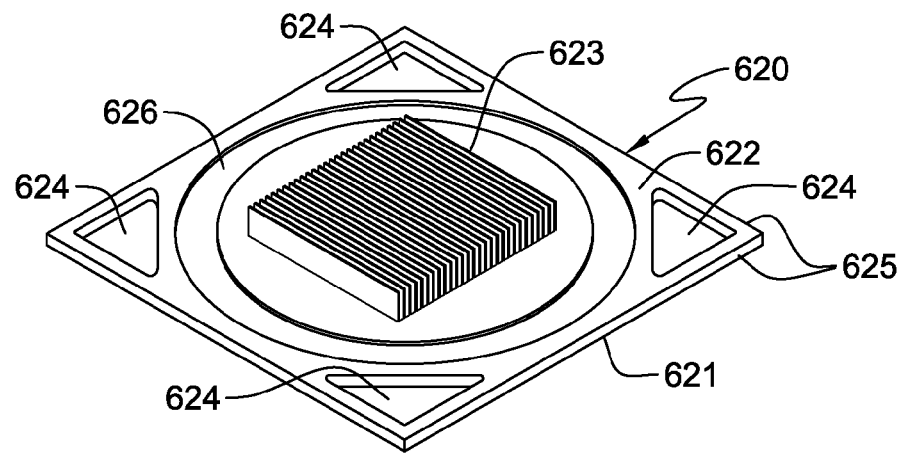
FIGS. 6A-6I depict one example of a composite heat sink structure being fabricated in accordance with the process of FIG. 5, in accordance with one or more aspects of the present invention.

Referring to FIG. 5, the composite heat sink structure fabrication process 500 (FIG. 5) begins with obtaining a thermally conductive base 505 (FIG. 5), one embodiment of which is depicted in FIG. 6A. As shown in FIG. 6A, a thermally conductive base 620 may be square or rectangular-shaped, by way of example. The thermally conductive base 620 may be fabricated of a good thermally conductive material, such as a metal or metal alloy, and include a base plate 622 with a main heat transfer surface 621 on a first side thereof, and a plurality of thermally conductive fins 623 projecting from a second side thereof. In the illustrated example, the plurality of thermally conductive fins 623 comprise a plurality of thermally conductive plate fins oriented substantially parallel, with a plurality of liquid coolant flow channels formed therebetween.

In the embodiment illustrated, thermally conductive base 620 includes peripheral openings 624 at the corners thereof, resulting in base edge portions 625 being defined at the corners. Further, a continuous groove 626 is provided in the second side of thermally conductive base 620 for receiving, at least in part, a compressible, continuous sealing member to be compressed against the thermally conductive base 620, as described below.

The thermally conductive base is positioned and aligned on a lower mold fixture 510 (FIG. 5), and an upper depart mold is aligned over the thermally conductive base on the lower mold fixture 515 (FIG. 5). One embodiment of this depicted in FIGS. 6B & 6C.

Figure 6B:
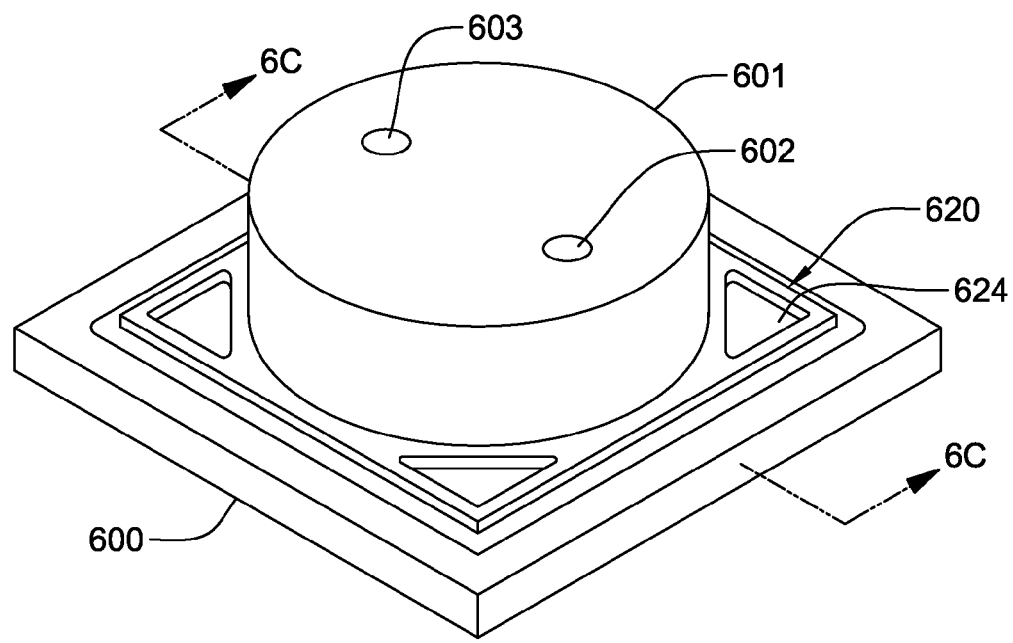
Figure 6C:
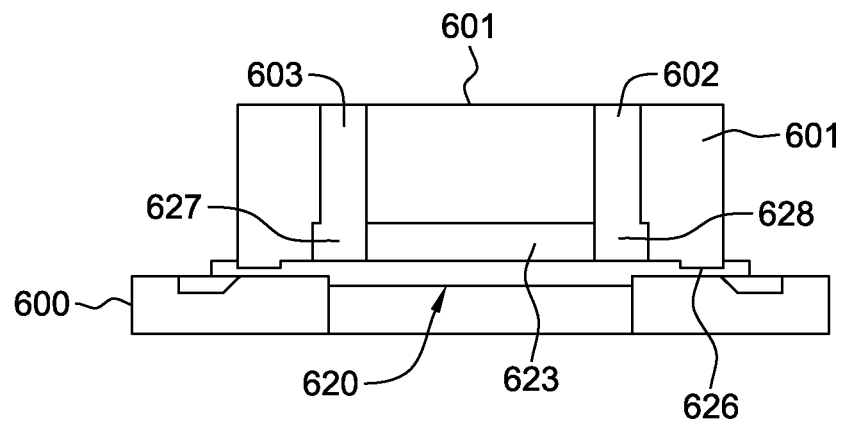

As illustrated in FIGS. 6B & 6C, thermally conductive base 620 is aligned on lower mold fixture 600, which may include one or more alignment features, for instance, one or more pedestals, with the thermally conductive base being configured to align to the one or more pedestals. Upper depart mold 601 is placed over the assembly, and in particular, is aligned over thermally conductive base 620, for instance, with a projection or ridge configured to seat within continuous groove 626 in thermally conductive base 620, and thereby ensure proper seating and alignment of upper depart mold 601 to thermally conductive base 620. As illustrated in the cross-sectional elevational view of FIG. 6C, upper depart mold 601 includes a depart material injection opening 602 and an air escape opening 603, and defines a depart mold cavity with a shape and size corresponding to the desired coolant-carrying compartment shape and size for the composite heat sink structure. Note that the upper depart mold 601 accommodates the plurality of thermally conductive fins 623, as shown in FIG. 6C, and includes, in this example, depart mold cavity space for a coolant inlet manifold region 627, and a coolant outlet manifold region 628 to be provided in the resultant heat sink structure.

Figure 6D:
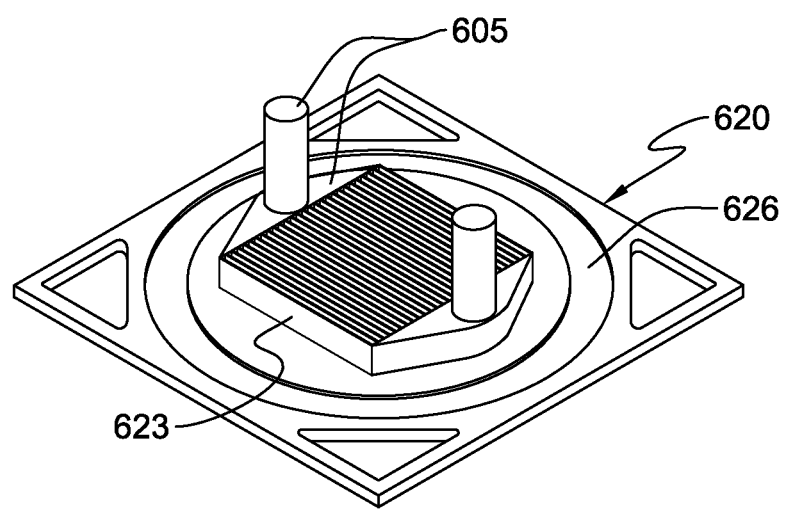

Depart material is injected into the depart mold cavity defined by upper depart mold 520 (FIG. 5) and the thermally conductive base, and the upper depart mold is removed, with any flash depart material being trimmed 525 (FIG. 5). One embodiment of the resultant structure is depicted in FIG. 6D, where depart material 605 is a sacrificial mold material configured with the desired shape for the coolant-carrying compartment and, in this example, the desired coolant inlet and coolant outlet tube openings that will be in fluid communication with the coolant-carrying compartment. Various depart materials may be employed for this process. For instance, the depart material may be a water-soluble mold material, such as polysulphone, which is described in U.S. Pat. No. 6,547,210 B1, or a polyvinyl alcohol, which is commercially available from Environmental Polymers, of Irlam, United Kingdom. As illustrated in FIG. 6D, depart material 605 fills the channels between the plurality of thermally conductive fins 623 extending from thermally conductive base 620.

Figure 6E:
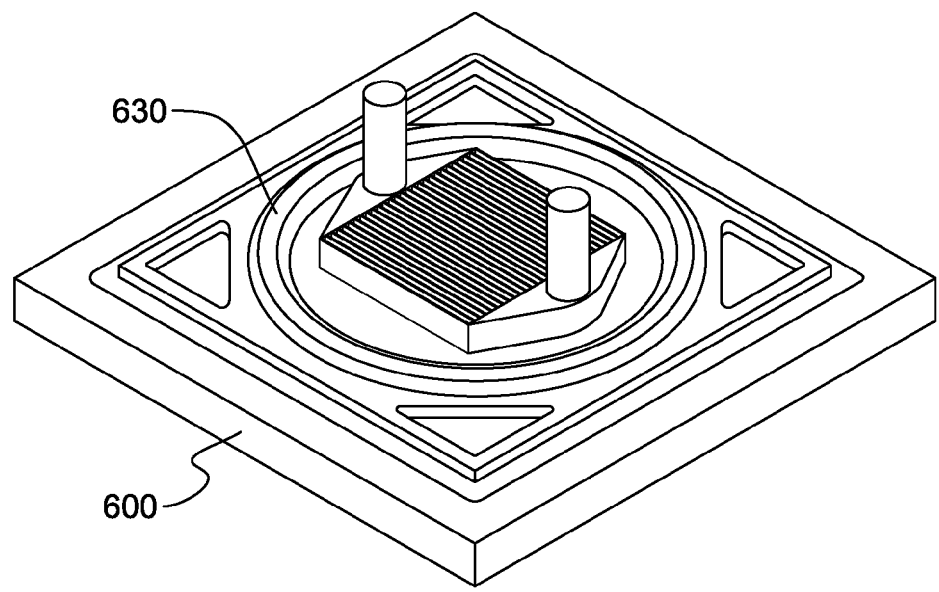

A compressible, continuous sealing member, such as an O-ring, and a sealing member retainer, are next placed onto the thermally conductive base 530 (FIG. 5). One embodiment of the resultant structure is depicted in FIG. 6E, where the compressible, continuous sealing member 630 and the compressible, continuous sealing member fit, in the depicted embodiment, within continuous groove 626 (FIG. 6D) in thermally conductive base 620, and sealing member retainer 630 may be a continuous sealing member retainer with a continuous groove 631 (shown in FIG. 6G). Note that, in the depicted embodiment, the compressible, continuous sealing member 625 (FIG. 6G) is also partially disposed within continuous groove 631 (FIG. 6G) in the continuous sealing member retainer 630.

Figure 6F:
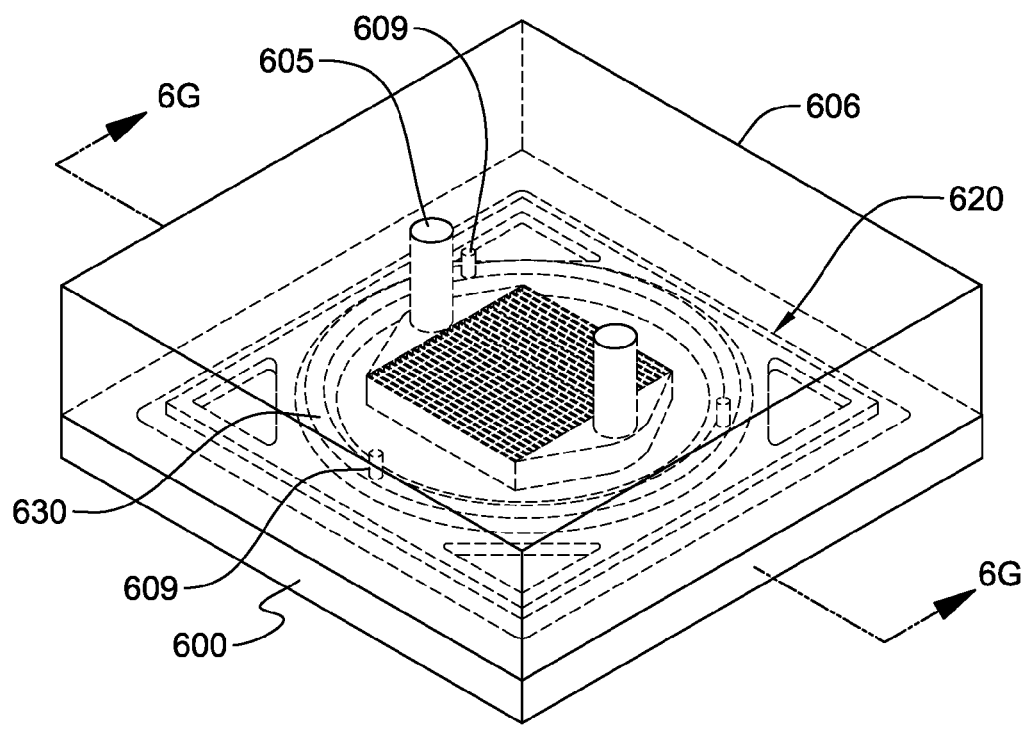

An upper, final mold fixture 606 is aligned over the thermally conductive base assembly on the lower mold fixture 535 (FIG. 5). One embodiment of this is depicted in FIG. 6F, and the cross-sectional view thereof of FIG. 6G. As illustrated, the upper, final mold fixture 606 defines a final mold cavity 615 having the shape and dimensions of the desired in situ molded member to be formed over the thermally conductive base 620, and sealing member retainer 630 assembly. Annulus openings are provided in the upper, final mold fixture 606 around depart material 605, with a first annulus opening 607 allowing for injection of mold material, such as the above-noted plastic mold material, and a second annulus opening 608 allowing for air escape during the in situ molding process. Multiple sealing member retainer pins 609 may be associated with upper, final mold fixture 606, and be sized and positioned to apply pressure against sealing member retainer 630 during the molding process to ensure compression of compressible, continuous sealing member 631 when the mold fixture assembly is placed in a mold machine (not shown). By way of example, three retainer pins 609 may be spaced around and in contact with the sealing member retainer 630 to ensure provision of a constant compressive force against the retainer, and thus against the compressible, continuous sealing member 625 during the mold process.

Figure 6G:
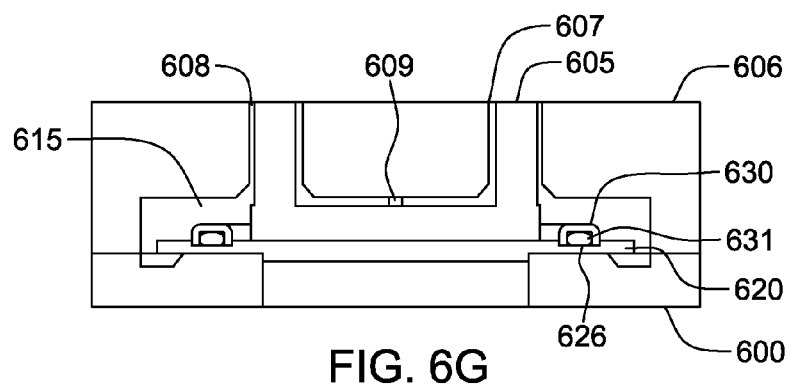
Figure 6H:
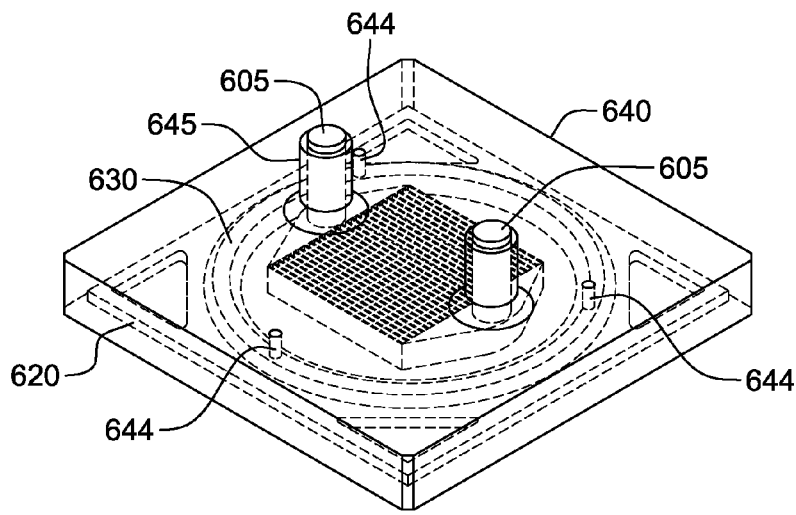
Figure 6I:
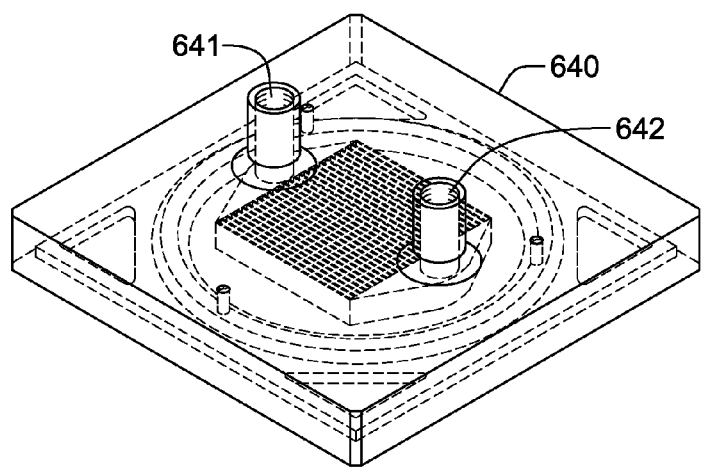

The mold or over-mold material is injected into the final mold cavity 540 (FIG. 5), with one embodiment of the mold cavity 615 being illustrated in FIG. 6G, and the resultant structure being depicted in FIG. 6H, that is, after removal of the final, upper mold fixture 606 (FIGS. 6F & 6G), and trimming of any flash mold material 545 (FIG. 5). FIG. 6H also illustrates the exemplary structure after providing inserts or plugs 644 to seal the openings resulting from the presence of the retainer pins 609 (FIG. 6G) within the final, upper mold fixture 550 (FIG. 5). As shown in FIG. 6H, the in situ molded member 640, for instance, formed of plastic material, includes upward-projecting tubes 645 around depart material 605, which after dissolving and washing out of the depart material 555 (FIG. 5), define a coolant inlet 641 and a coolant outlet 642 in the in situ molded member 640 in fluid communication with the coolant-carrying compartment of the composite heat sink structure, as shown in FIG. 6I.

Figure 7:
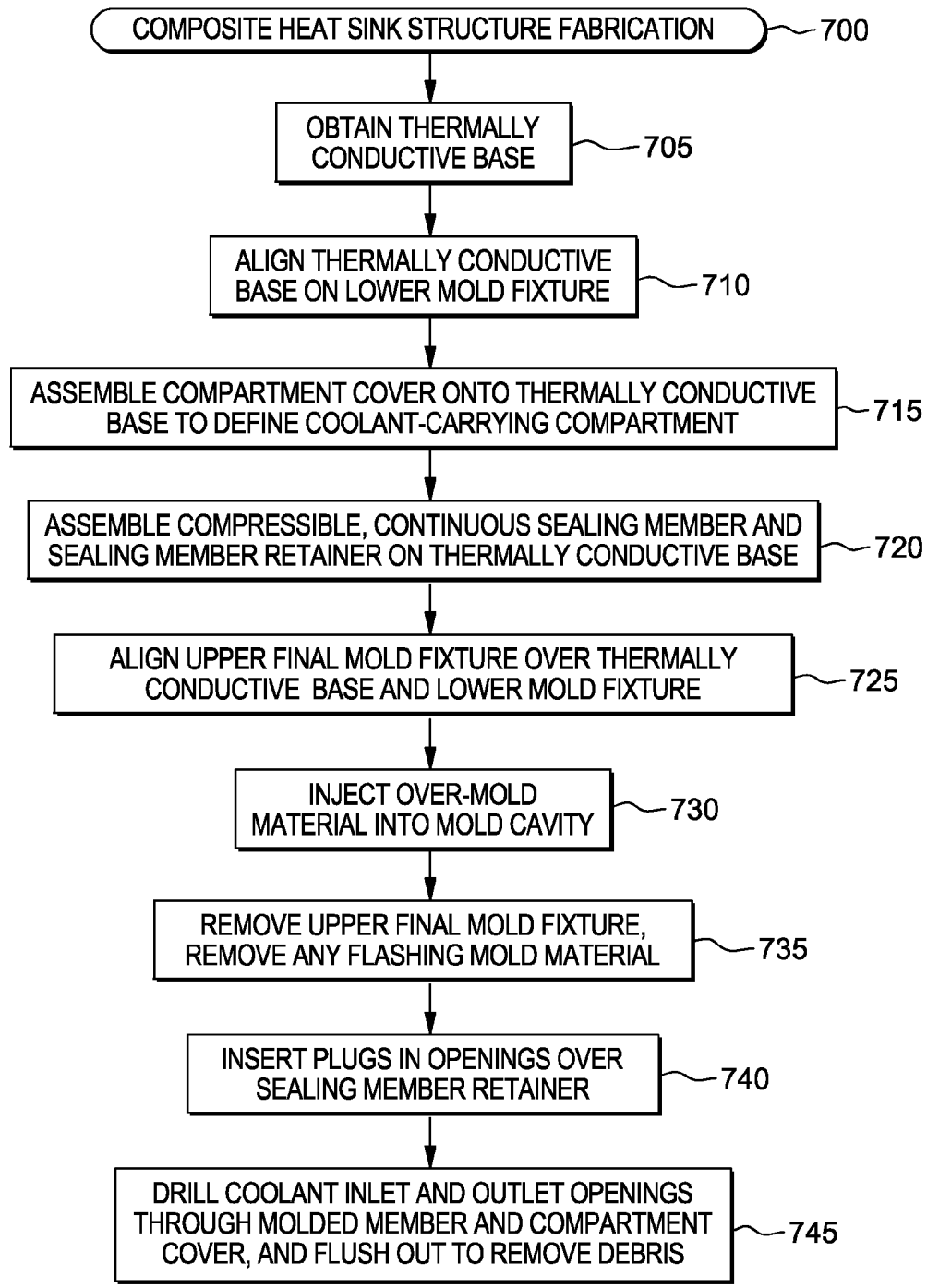
FIG. 7 is a flowchart of another embodiment of a process of fabricating a composite heat sink structure, in accordance with one or more aspects of the present invention.

Another embodiment of a composite heat sink fabrication process is depicted in FIG. 7, and illustrated by the exemplary composite heat sink structure fabrication of FIGS. 8A-8H. As illustrated in FIG. 7, the composite heat sink structure fabrication process 700 begins with obtaining a thermally conductive base 705, such as the above-described thermally conductive base 620 of FIG. 6A, which is again depicted in FIG. 8A.

The fabrication process includes aligning the thermally conductive base on the lower mold fixture 710 (FIG. 7), and placing a compartment cover onto the thermally conductive base to define a coolant-carrying compartment between the thermally conductive base and the compartment cover 715 (FIG. 7). The compartment cover may also be sealed along its periphery to the thermally conductive base using, for instance, epoxy, solder, or other sealing means, to provide a fluid-tight seal between the compartment cover and the thermally conductive base, with one embodiment of the compartment cover 800 being illustrated in FIG. 8B, by way of example only. Note that compartment cover 800 accommodates the plurality of thermally conductive fins 623, and may include regions at opposite sides of the plurality of thermally conductive fins for forming a coolant inlet manifold region and a coolant outlet manifold region within the coolant-carrying compartment. Note also that the particular compartment insert 800 is provided by way of example only, and may have any configuration and size, as required to define a desired coolant-carrying compartment (FIG. 8E) between compartment insert 800 and thermally conductive base 620.

Figure 8A:
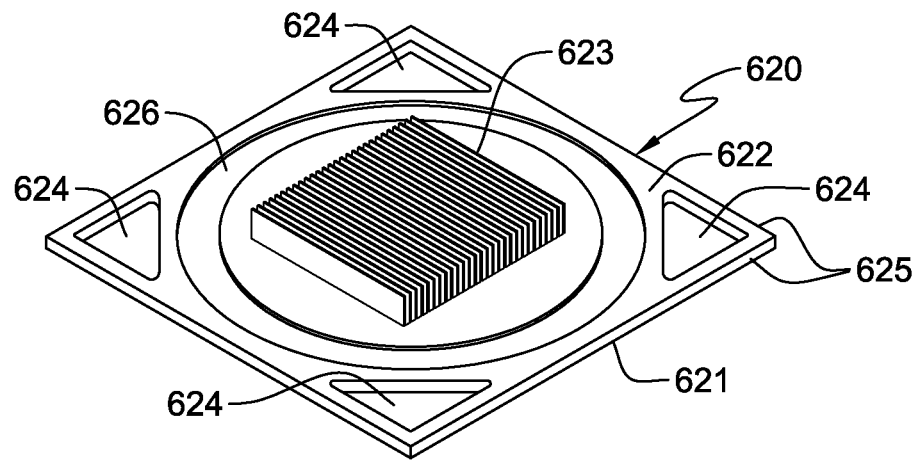
FIGS. 8A-8H illustrate one example of a composite heat sink structure being fabricated in accordance with the process of FIG. 7, in accordance with one or more aspects of the present invention.
Figure 8B:
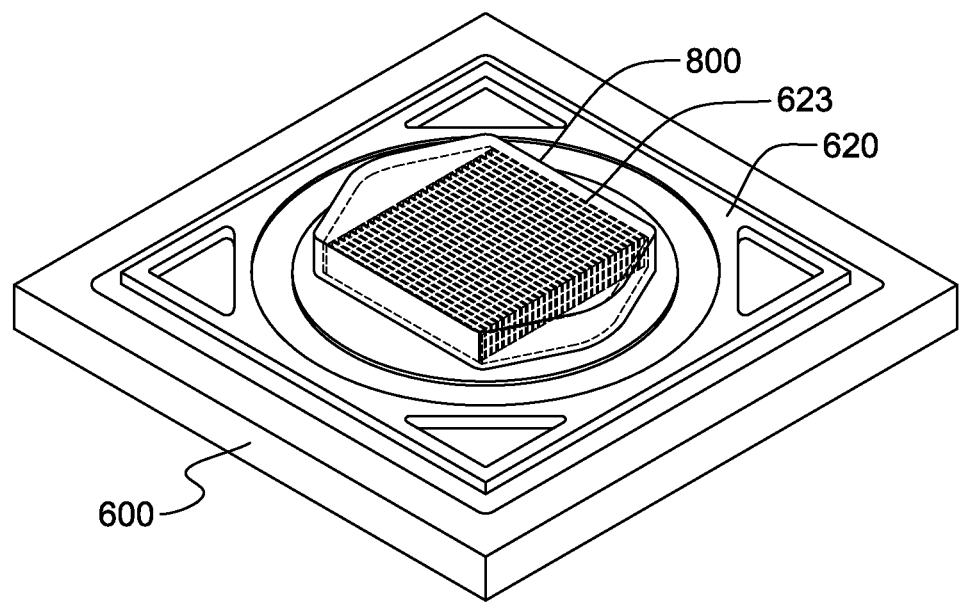
Figure 8C:
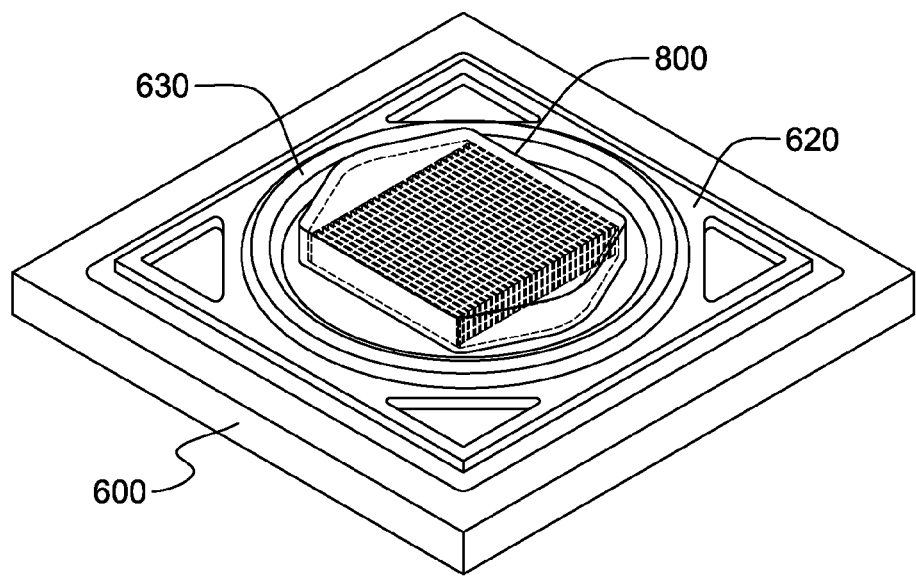

Next, a compressible, continuous sealing member is placed onto the thermally conductive base, and a sealing member retainer is provided overlying, and in one or more embodiments, enclosing, the compressible, continuous sealing member 720 (FIG. 7). By way of example, compressible, continuous sealing member 625 (see FIG. 8E) may be provided, sized and configured to reside, at least in part, within continuous groove 626 of thermally conductive base 620. Further, sealing member retainer 630 (FIG. 8C) may be a continuous sealing member retainer, with a continuous groove 631 (FIG. 8E) which accommodates, at least in part, compressible, continuous sealing member 625 when assembled as illustrated in FIGS. 8C & 8E. Note that continuous grooves 631, 626 may have depths, and sealing member retainer 630 may have a height and thickness, selected to ensure that compressible, continuous sealing member 625 is compressed within the grooves when a force is applied to the sealing member retainer.

Figure 8D:
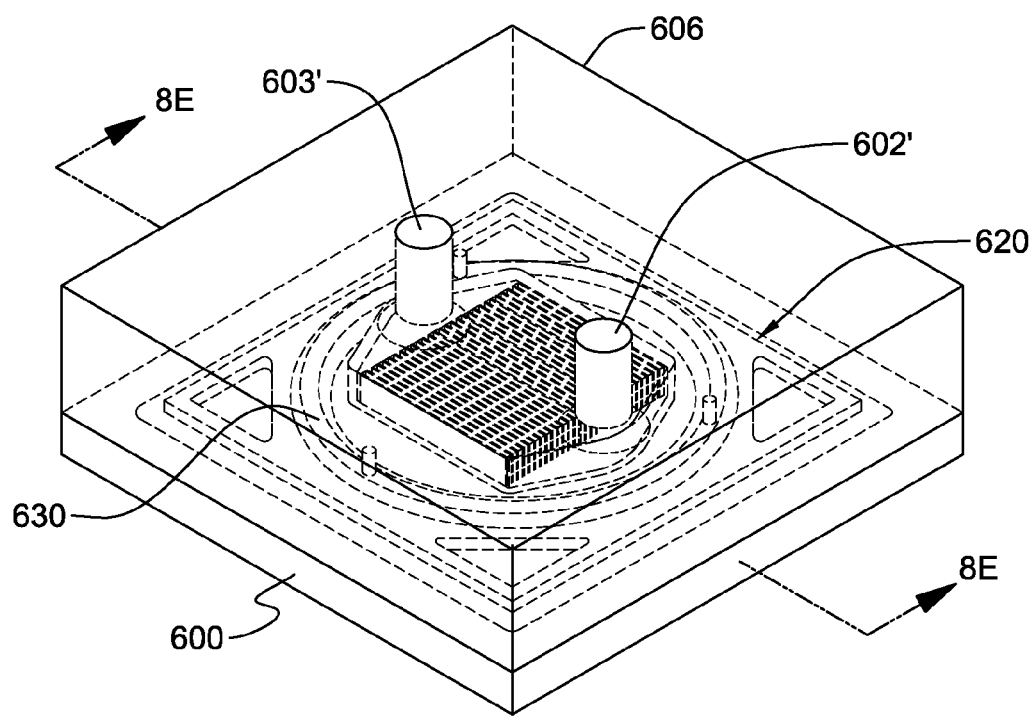
Figure 8E:
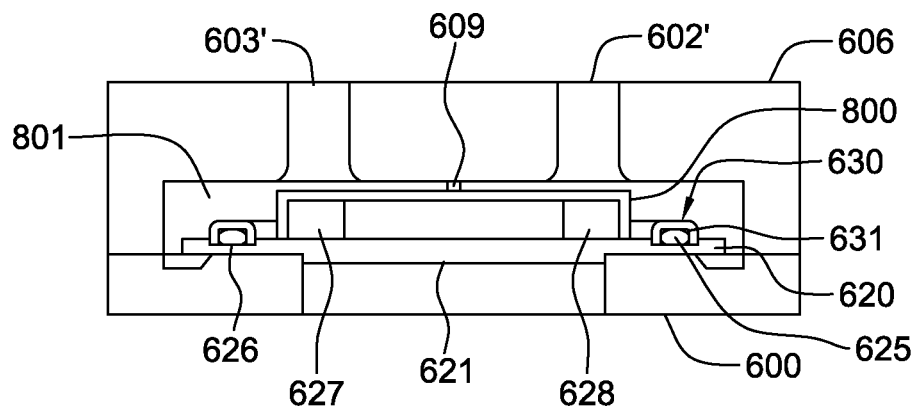

The upper, final mold fixture is aligned over the thermally conductive base on the lower mold fixture 725 (FIG. 7), one embodiment of which is depicted in FIGS. 8D & 8E. As illustrated, upper, final mold fixture 606 defines a mold cavity 801 over thermally conductive base 620, compressible, continuous sealing member 625, sealing member retainer 630, and compartment cover 800 on lower mold fixture 600. In FIG. 8E, compartment cover 800 is shown to accommodate the plurality of thermally conductive fins 623, and provide space for a coolant inlet manifold region 627, and a coolant outlet manifold region 628, on opposite sides of the plurality of thermally conductive fins 623. The upper, final mold fixture 606 includes a mold material injection opening 602', and an air escape opening 603', used to introduce mold material into mold cavity 801 of the assembly. As noted, the mold material may be any of various plastic materials, such as any of the above-noted thermoplastic materials.

Figure 8F:
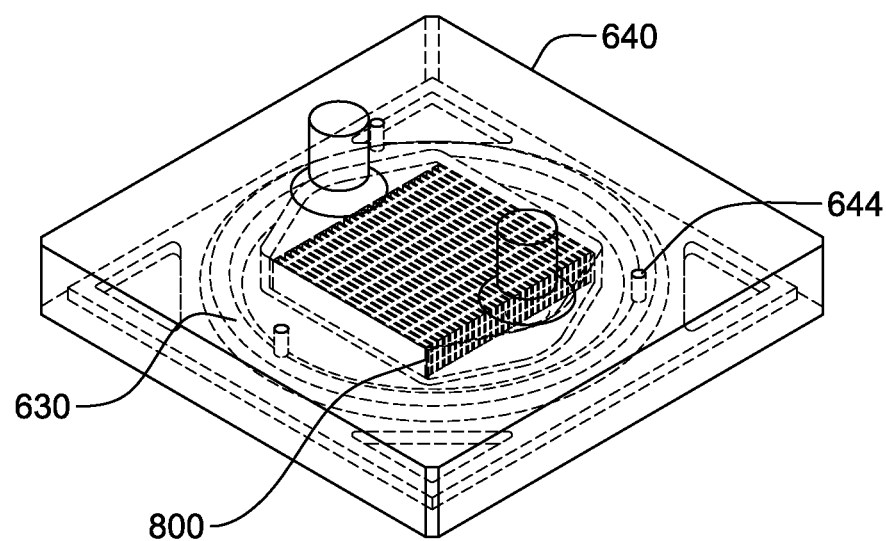
Figure 8G:
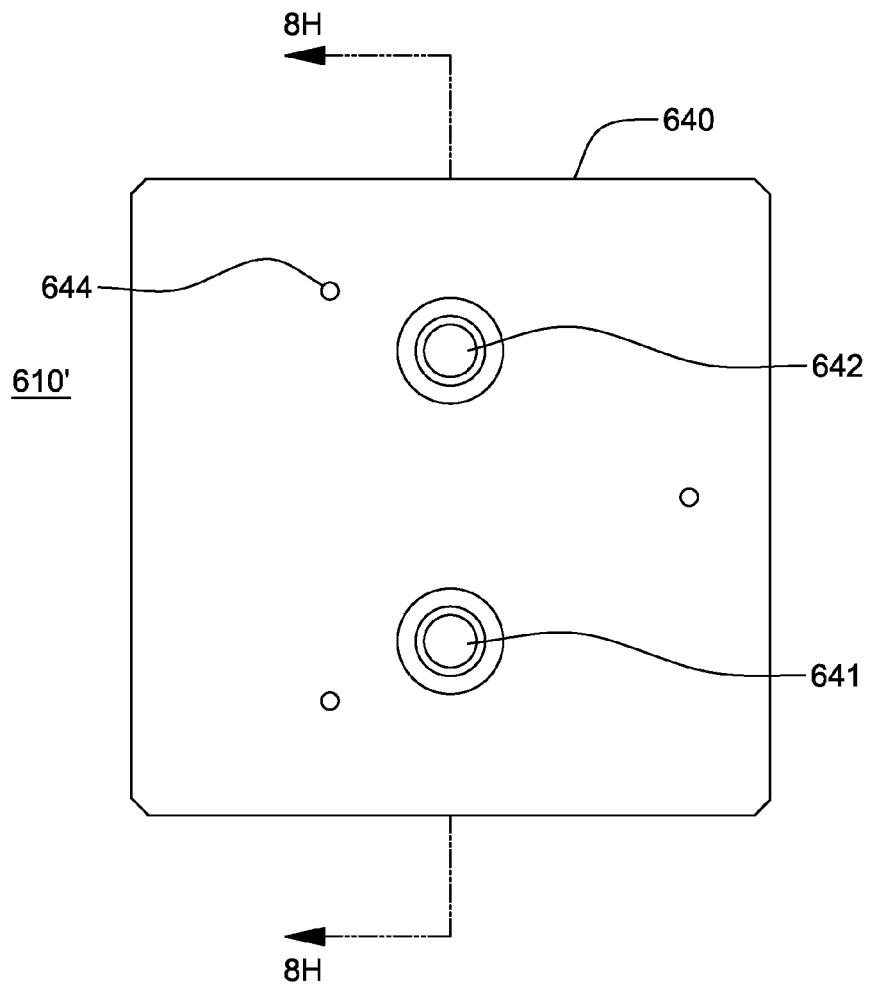
Figure 8H:
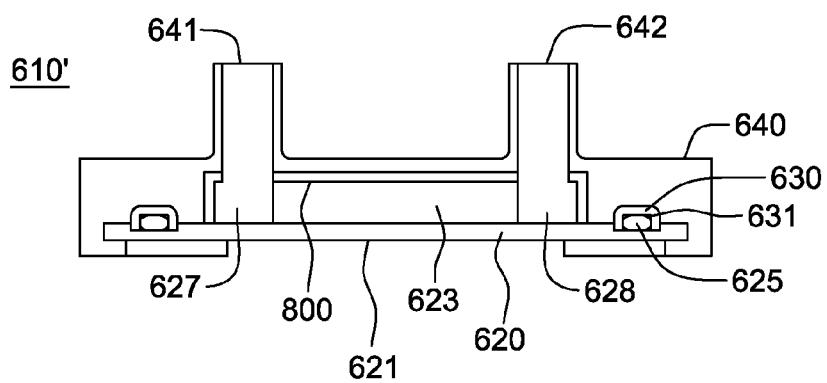
Figure 9B:
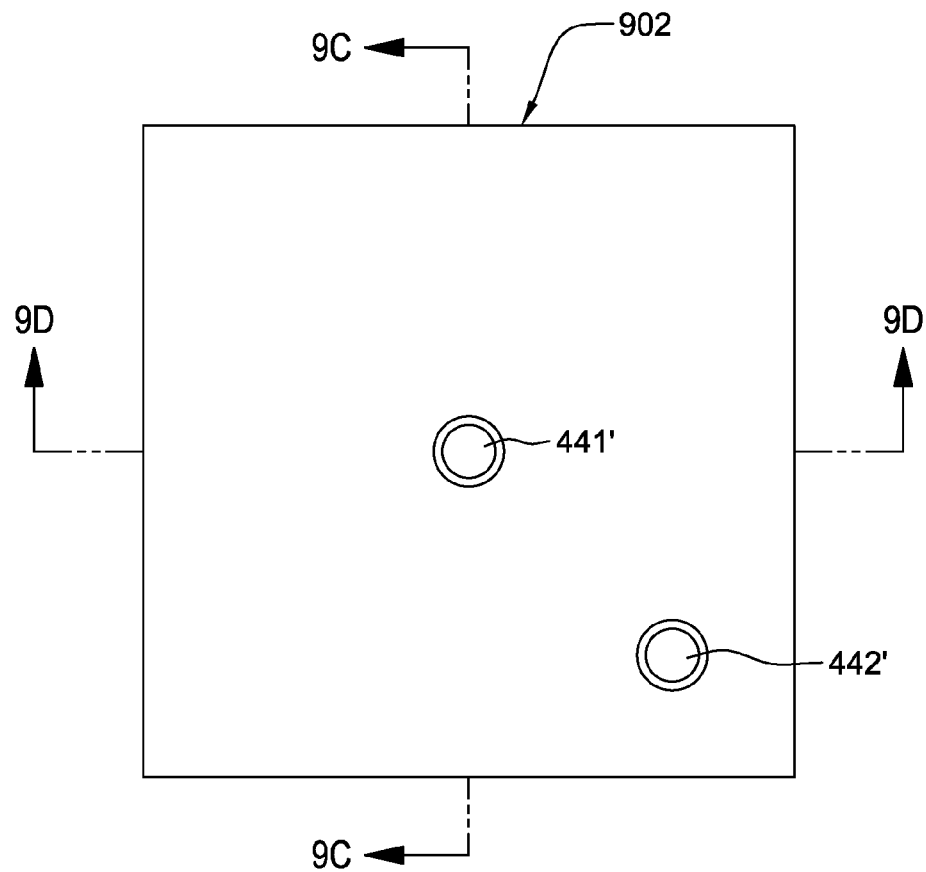
FIG. 9B is a plan view of the composite heat sink structure of FIG. 9A, in accordance with one or more aspects of the present invention.
Figure 9C:
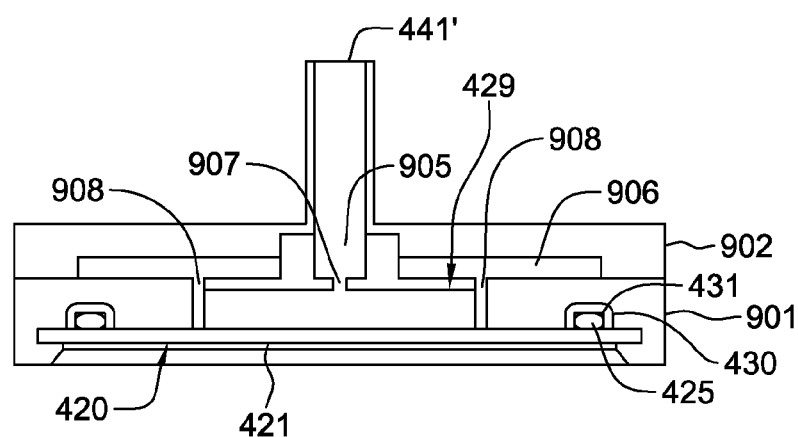
FIG. 9C is a cross-sectional elevational view of the composite heat sink structure of FIG. 9B, taken along line 9C-9C thereof, in accordance with one or more aspects of the present invention.
Figure 9D:
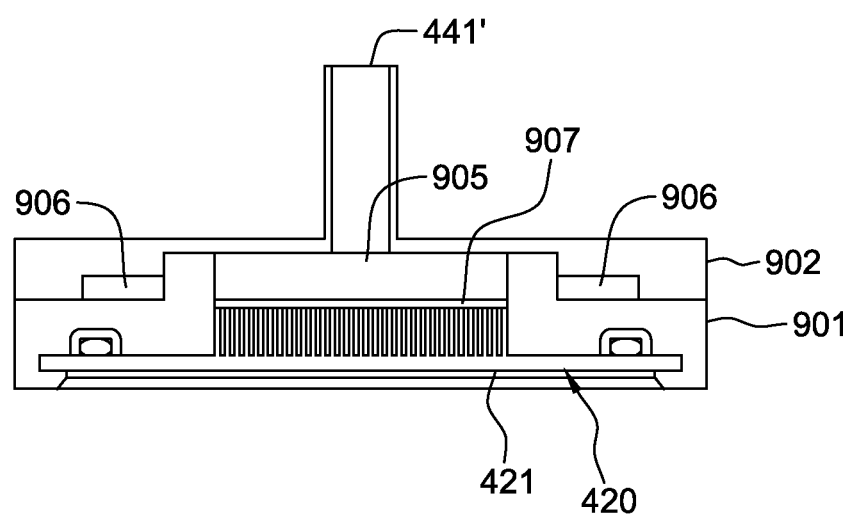
FIG. 9D is a cross-sectional elevational view of the composite heat sink structure of FIG. 9B, taken along line 9D-9D thereof, in accordance with one or more aspects of the present invention.

The mold or over-mold material is injected into the mold cavity 730 (FIG. 7), and the upper, final mold fixture is removed, along with any flash mold material 735 (FIG. 7). Plugs may be inserted into or formed within the retainer pin openings 740 (FIG. 7), and the coolant inlet and coolant outlet openings may be drilled and flushed to remove debris 745 (FIG. 7). One embodiment of this process is depicted in FIGS. 8F-8H, with FIG. 8F illustrating the structure before drilling of the molded member and compartment cover. As shown in FIGS. 8G & 8H, the resultant in situ molded member 640 may include coolant inlet 641 and coolant outlet 642, along with insert plugs 644, which ensure fluid-tight sealing of the composite heat sink structure 610' where the retainer pins were located during the molding process. Note that drilling of the coolant inlet and outlet openings 641, 642 proceeds through the upward extensions of the in situ molded material 640 shown in FIG. 8F, and through the compartment cover 800, to define inlet and outlet orifices into the coolant-carrying compartment, and in particular, respective orifices in fluid communication with the coolant inlet manifold region 627 and coolant outlet manifold region 628 thereof.

Numerous composite heat sink structure configurations embodying the concepts disclosed herein are possible. For instance, FIGS. 9A-9D depict an alternate implementation of the composite heat sink structure of FIGS. 4A-4D, where the composite heat sink structure 910 includes a manifold structure 900, with a lower manifold member 901 and an upper manifold member 902.

More particularly, referring collectively to FIGS. 9A-9D, composite heat sink structure 910 comprises, for instance, thermally conductive base 420, compressible, continuous sealing member 425, and sealing member retainer 430, such as described above, and an in situ molded member, which in this example, may be formed as lower manifold member 901. That is, lower manifold member 901 may be formed in situ using, for instance, one of the above-described molding processes, with the appropriate upper, final mold fixture, to achieve the desired lower manifold member 901 configuration. As in the embodiments described above, thermally conductive base 420 and in situ molded member (or lower manifold member 901) may be formed of different materials, with thermally conductive base 420 being fabricated of a metal, for instance, copper or aluminum, or a metal alloy, such as a copper or aluminum alloy, and the in situ molded member, or lower manifold member 901 in this example, being fabricated of a different, less expensive, and less thermally conductive material, such as, for instance, a plastic. By way of example, the plastic could be a thermoplastic, such as Polyethylene (PE), Polypropylene (PP), Polyvinyl Chloride (PVC), Polytetrafluoroethylene (PTFE), Polyether Ether Keytone (PEEK), etc.

As noted above, in one or more implementations, the sealing member retainer 430 may also be fabricated of plastic, and may be chosen such that the in situ molded member, that is, the lower manifold member 901, bonds to the sealing member retainer 430 during the molding process. For instance, the sealing member retainer may be formed of a same plastic material as the in situ molded member or a plastic material that is soluble with the plastic material of the in situ molded member, such that the lower manifold member 901 fuses to sealing member retainer 430 during the in situ molding process, and thereby forms a strong, fluid-tight bond between the lower manifold member and the sealing member retainer. Further, in one or more implementations, upper manifold member 902 may be separately manufactured of, for instance, a plastic material, for instance, by injection-molding, and subsequently bonded to the lower manifold member 901 using any known plastic-joining technique, or mechanically coupled using appropriate fasteners and seals.

In the depicted implementation, thermally conductive base 420 and lower manifold member 901, that is, the in situ molded member, define between them the coolant-carrying compartment 429 (FIG. 9C) within which the plurality of thermally conductive fins 423 extend. Note that the coolant-carrying compartment within the heat sink structure could be variously configured with, for instance, one or more chambers, channels, passageways, etc., depending on the requirements of a particular heat removal implementation. Coolant-carrying compartment 429 is a fluid-tight compartment through which liquid coolant flows between a coolant inlet 441' and a coolant outlet 442' formed in upper manifold member 902. Note that coolant inlet 441' and coolant outlet 442' are illustrated tubular-shaped, as one example only. The coolant inlet and outlet 441', 442' may be alternatively fabricated to include, for instance, hose barbs, threaded connections (SAE, NPT, etc.), tube sockets, etc., for joining the coolant inlet 441' and coolant outlet 442' to respective conduits of an associated cooling system, such as the exemplary systems described above in connection with FIGS. 1-3.

In the embodiment illustrated, lower manifold member 901, that is, the in situ molded member, includes a coolant inlet manifold region 905, and together, lower manifold member 901 and upper manifold member 902 define a coolant outlet manifold region 906. One or more inlet orifices 907 are provided in fluid communication with coolant inlet manifold region 905 and the coolant-carrying compartment 429, and one or more outlet orifices 908 are provided in fluid communication with coolant outlet manifold region 906 and the coolant-carrying compartment 429. Further, coolant inlet 441' is in fluid communication with coolant inlet manifold region 905, and coolant outlet 442' is in fluid communication with coolant outlet manifold region 906. In operation, liquid coolant flows (in one example) through coolant inlet 441', coolant inlet manifold region 905, inlet orifice(s) 907, coolant-carrying compartment 429, outlet orifice(s) 908, and coolant outlet manifold region 906, to coolant outlet 442'. Note with respect to coolant flow, that with the inlet orifice(s) 907 disposed over the plurality of thermally conductive fins 423, in a central region of the coolant-carrying compartment 429, liquid coolant enters the coolant-carrying compartment and, in one example, bifurcates upon contact with base plate 422 for outward flow in opposite directions within the channels defined between adjacent fins of the plurality of thermally conductive fins 423 for exhausting via outlet orifices 908 in lower manifold member 901.

As with the above examples, other configurations of thermally conductive fins could be employed in the composite heat sink structure 910 of FIGS. 9A-9D. Reference in this regard, the alternate thermally conductive pin fin configuration of FIG. 4E. Further, composite heat sink structures may be formed, in accordance with the concepts disclosed herein, without the use of thermally conductive fins within the coolant-carrying compartment.

Note that lower manifold member 901 may include multiple inserts 444' to plug the retainer pin openings formed during the in situ molding process. As noted, retainer pins may be used during the in situ molding process to ensure compressive loading against the sealing member retainer 430, and thus, against the compressible, continuous sealing member 431 disposed between the sealing member retainer 430 and thermally conductive base 420, to ensure a good, fluid-tight seal therebetween once the in situ molded member has hardened.

As with the embodiments described above, the composite heat sink structure of FIGS. 9A-9D is characterized, at least in part, by the in situ molded member being molded in place over the thermally conductive base, resulting in minimizing the profile of the composite heat sink structure, and for instance, eliminating the need for separate mechanical fasteners to secure a lid or manifold structure to the thermally conductive base. Further, the composite heat sink structure includes a compressible, continuous sealing member which is compressed against the thermally conductive base by a sealing member retainer, held in position during the in situ molding process, with the resultant in situ molded member being molded over, in part, the sealing member retainer and securing the retainer in place, so that a good fluid-tight seal is formed between the structures around the periphery of the coolant-carrying compartment.

Advantageously, the composite heat sink structures disclosed provide enhanced sealing between the composite components of the structures to ensure leakage does not occur, notwithstanding (for instance) that the thermally conductive base and in situ molded member are fabricated of different materials. The provision of an in situ molded member over the thermally conductive base advantageously facilitates forming a more compact heat sink structure compared, for instance, with an implementation where the components of the heat sink structure are mechanically fastened together, for instance, along the periphery of the structure using separate fasteners.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention.

What is claimed is:

1. An apparatus comprising:
   a composite heat sink structure including:
      a thermally conductive base, the thermally conductive base including a main heat transfer surface to couple to at least one component to be cooled;
      a compressible, continuous sealing member;
      a sealing member retainer compressing the compressible, continuous sealing member against the thermally conductive base;
      an in situ molded member molded over and affixed to the thermally conductive base, and molded over and securing in place the sealing member retainer, wherein a coolant-carrying compartment resides between the thermally conductive base and the in situ molded member and wherein the in situ molded member is a unitary member that contacts a surface of the thermally conductive base opposite to the main heat transfer surface and wraps around at least a portion of the thermally conductive base to secure the in situ molded member to the thermally conductive base absent use of separate fasteners; and a coolant inlet and a coolant outlet, the coolant inlet and coolant outlet being in fluid communication with the coolant-carrying compartment to facilitate liquid coolant flow therethrough.

2. The apparatus of claim 1, wherein the thermally conductive base is fabricated of a metal or metal alloy, and the in situ molded member comprises a plastic.

3. The apparatus of claim 1, wherein the in situ molded member comprises a first plastic, and the sealing member retainer comprises a second plastic, the first plastic and the second plastic being a same plastic or soluble plastics, and the in situ molded member is fused to the sealing member retainer.

4. The apparatus of claim 1, wherein the thermally conductive base includes at least one peripheral opening therein, and wherein the in situ molded member extends through the at least one peripheral opening to encircle the portion of the thermally conductive base.

5. The apparatus of claim 1, wherein the in situ molded member comprises an in situ molded lid of the composite heat sink structure, the in situ molded lid comprising the coolant inlet and the coolant outlet.

6. The apparatus of claim 5, further comprising a plurality of thermally conductive fins disposed within the coolant-carrying compartment to facilitate transfer of heat from the thermally conductive base to the liquid coolant flow through the coolant-carrying compartment, and wherein the coolant-carrying compartment further includes a coolant inlet manifold region in fluid communication with the coolant inlet, and a coolant outlet manifold region in fluid communication with the coolant outlet, wherein coolant within the coolant-carrying compartment flows from the coolant inlet manifold region, between the plurality of thermally conductive fins, to the coolant outlet manifold region.

7. The apparatus of claim 5, further comprising a compartment cover, the coolant-carrying compartment being defined between the compartment cover and the thermally conductive base, and wherein the in situ molded member is further molded over and affixed to the compartment cover.

8. The apparatus of claim 1, wherein the composite heat sink structure further comprises a manifold structure disposed over the thermally conductive base, the manifold structure including an upper manifold member and a lower manifold member, the lower manifold member comprising the in situ molded member.

9. The apparatus of claim 8, wherein the manifold structure comprises the coolant inlet and the coolant outlet, and at least one inlet orifice in fluid communication with the coolant inlet and the coolant-carrying compartment, and at least one outlet orifice in fluid communication with the coolant-carrying compartment and the coolant outlet, wherein liquid coolant flows through the coolant inlet, the at least one inlet orifice, the coolant-carrying compartment, and the at least one outlet orifice, to the coolant outlet.

10. The apparatus of claim 9, wherein the at least one inlet orifice comprises at least one inlet slot positioned over a central region of the coolant-carrying compartment, the at least one inlet slot facilitating the liquid coolant flow into the coolant-carrying compartment in the central region thereof.

11. The apparatus of claim 1, wherein the main heat transfer surface resides at a first side of the thermally conductive base, and wherein the compressible, continuous sealing member is compressed against a second side of the thermally conductive base, the first side and the second side being opposite sides of the thermally conductive base.

12. The apparatus of claim 11, wherein the sealing member retainer comprises a continuous sealing member retainer with a continuous groove, the compressible, continuous sealing member being covered by the continuous sealing member retainer and residing, at least in part, within the continuous groove in the continuous sealing member retainer.

13. The apparatus of claim 11, wherein the thermally conductive base further comprises a continuous groove in the second side thereof, the compressible, continuous sealing member residing, at least in part, within the continuous groove in the second side of the thermally conductive base.

14. An apparatus comprising:
at least one electronic component; and
a composite heat sink structure coupled to the at least one electronic component to facilitate cooling thereof, the composite heat sink structure including:
a thermally conductive base, the thermally conductive base including a main heat transfer surface coupled to the at least one electronic component;
a compressible, continuous sealing member;
a sealing member retainer compressing the compressible, continuous sealing member against the thermally conductive base;
an in situ molded member molded over and affixed to the thermally conductive base, and molded over and securing in place the sealing member retainer, wherein a coolant-carrying compartment resides between the thermally conductive base and the in situ molded member and wherein the in situ molded member is a unitary member that contacts a surface of the thermally conductive base opposite to the main heat transfer surface and wraps around at least a portion of the thermally conductive base to secure the in situ molded member to the thermally conductive base absent use of separate fasteners; and
a coolant inlet and a coolant outlet, the coolant inlet and the coolant outlet being in fluid communication with the coolant-carrying compartment to facilitate liquid coolant flow therethrough.

15. The apparatus of claim 14, wherein the thermally conductive base is fabricated of a metal or metal alloy, and the in situ molded member comprises a first plastic, and the sealing member retainer comprises a second plastic, the first plastic and the second plastic being a same plastic or soluble plastics, and the in situ molded member being fused to the sealing member retainer.

16. The apparatus of claim 14, wherein the thermally conductive base includes at least one peripheral opening therein, the in situ molded member extending through the at least one peripheral opening to encircle a portion of the thermally conductive base.

17. The apparatus of claim 14, wherein the in situ molded member comprises an in situ molded lid of the composite heat sink structure, the in situ molded lid comprising the coolant inlet and the coolant outlet.

18. The apparatus of claim 14, wherein the composite heat sink structure further comprises a manifold structure disposed over the thermally conductive base, the manifold structure including an upper manifold member and a lower manifold member, the lower manifold member comprising the in situ molded member.

19. The apparatus of claim 14, wherein the main heat transfer surface resides at a first side of the thermally conductive base, and wherein the compressible, continuous sealing member is compressed against a second side of the thermally conductive base, the first side and the second side being opposite sides of the thermally conductive base, and wherein the sealing member retainer comprises a continuous sealing member retainer with a continuous groove, the compressible, continuous sealing member being covered by the continuous sealing member retainer and residing, at least in part, within the continuous groove in the continuous sealing member retainer.

\* \* \* \* \*